(12) United States Patent
Chodavarapu et al.

(10) Patent No.: US 11,664,781 B2
(45) Date of Patent: May 30, 2023

(54) METHODS AND DEVICES FOR MICROELECTROMECHANICAL RESONATORS

(71) Applicant: Stathera IP Holdings Inc., Montreal (CA)

(72) Inventors: Vamsy Chodavarapu, Brossard (CA); George Xereas, Montreal (CA)

(73) Assignee: Stathera IP Holdings Inc., Montreal (CA)

( * ) Notice: Subject to any disclaimer, the term of this patent is extended or adjusted under 35 U.S.C. 154(b) by 205 days.

(21) Appl. No.: 16/948,328

(22) Filed: Sep. 14, 2020

(65) Prior Publication Data

US 2020/0407218 A1 Dec. 31, 2020

Related U.S. Application Data

(63) Continuation-in-part of application No. 16/369,757, filed on Mar. 29, 2019, which is a continuation of
(Continued)

(51) Int. Cl.
*H03H 9/10* (2006.01)
*H03H 9/24* (2006.01)
(Continued)

(52) U.S. Cl.
CPC .......... *H03H 9/1057* (2013.01); *B81B 7/007* (2013.01); *B81C 1/00182* (2013.01);
(Continued)

(58) Field of Classification Search
CPC ............ B81C 1/00182; B81C 1/00269; B81C 1/00301; B81B 7/007; B81B 2203/0307;
(Continued)

(56) References Cited

U.S. PATENT DOCUMENTS

| 3,590,343 A | 6/1971 | Nathanson et al. |
| 2012/0142144 A1* | 6/2012 | Taheri ................... B81C 1/0023 438/107 |

(Continued)

FOREIGN PATENT DOCUMENTS

WO  2010003228 A1  1/2010

OTHER PUBLICATIONS

Nabki et al., "A highly integrated 1.8 GHz frequency synthesizer based on a MEMS resonator," IEEE Journal of Solid State Circuits, Aug. 2009, pp. 2154-2168, vol. 44, No. 8, Institute of Electrical and Electronics Engineers.

(Continued)

*Primary Examiner* — Rakesh B Patel
*Assistant Examiner* — Jorge L Salazar, Jr.
(74) *Attorney, Agent, or Firm* — Lee Sullivan Shea & Smith LLP

(57) ABSTRACT

MEMS based sensors, particularly capacitive sensors, potentially can address critical considerations for users including accuracy, repeatability, long-term stability, ease of calibration, resistance to chemical and physical contaminants, size, packaging, and cost effectiveness. Accordingly, it would be beneficial to exploit MEMS processes that allow for manufacturability and integration of resonator elements into cavities within the MEMS sensor that are at low pressure allowing high quality factor resonators and absolute pressure sensors to be implemented. Embodiments of the invention provide capacitive sensors and MEMS elements that can be implemented directly above silicon CMOS electronics.

20 Claims, 21 Drawing Sheets

Related U.S. Application Data application No. 14/790,220, filed on Jul. 2, 2015, now Pat. No. 10,291,200.

(60) Provisional application No. 62/020,049, filed on Jul. 2, 2014.

(51) Int. Cl.

| | |
|---|---|
| *H03H 9/05* | (2006.01) |
| *B81C 1/00* | (2006.01) |
| *H03H 3/007* | (2006.01) |
| *B81B 7/00* | (2006.01) |
| *G01L 9/12* | (2006.01) |
| *G01L 9/00* | (2006.01) |

(52) U.S. Cl.
CPC ...... *B81C 1/00269* (2013.01); *B81C 1/00301* (2013.01); *G01L 9/0042* (2013.01); *G01L 9/0073* (2013.01); *G01L 9/12* (2013.01); *H03H 3/0072* (2013.01); *H03H 3/0073* (2013.01); *H03H 9/0561* (2013.01); *H03H 9/2405* (2013.01); *H03H 9/2426* (2013.01); *H03H 9/2431* (2013.01); *H03H 9/2436* (2013.01); *B81B 2203/0307* (2013.01); *H03H 9/2452* (2013.01); *H03H 9/2463* (2013.01); *H03H 9/2473* (2013.01); *H03H 9/2478* (2013.01); *H03H 2009/2442* (2013.01)

(58) Field of Classification Search
CPC ....... G01L 9/0042; G01L 9/0073; G01L 9/12; H03H 3/0072; H03H 3/0073; H03H 9/0561; H03H 9/1057; H03H 9/2405; H03H 9/2426; H03H 9/2431; H03H 9/2436; H03H 9/2452; H03H 9/2463; H03H 9/2473; H03H 9/2478; H03H 2009/2442; H03H 9/0557; H03H 2009/02385; H03H 2009/02496; H03H 2009/02503; H03H 2009/02519; H03H 2009/02527; H03H 9/02228
USPC .................................................. 333/186, 187
See application file for complete search history.

(56) References Cited

U.S. PATENT DOCUMENTS

| | | | |
|---|---|---|---|
| 2013/0134837 A1* | 5/2013 | Saito ................... | B81C 1/00476 310/365 |
| 2014/0125359 A1 | 5/2014 | El-Gamal et al. | |

OTHER PUBLICATIONS

Hopcroft, "Temperature-stabilized silicon resonators for frequency references," Dissertation for the Degree of Doctor of Philosophy, Sep. 2007, Chapter 3, pp. 37-82, Department of Mechanical Engineering, Stanford University, Stanford, California, USA.

Nabki et al., "Low-stress CMOS-compatible silicon carbide surface-micromachining technology—Part I: Process development and characterization," Journal of Microelectromechanical Systems, Jun. 2011, pp. 720-729, vol. 20, No. 3, Institute of Electrical and Electronics Engineers.

Nabki et al., "Low-stress CMOS-compatible silicon carbide surface-micromachining technology—Part II: Beam resonators for MEMS above IC," Journal of Microelectromechanical Systems, Jun. 2011, pp. 730-744, vol. 20, No. 3, Institute of Electrical and Electronics Engineers.

Nguyen, "Mems technology for timing and frequency control," IEEE Transactions on Ultrasonics, Ferroelectrics, and Frequency Control, Feb. 2007, pp. 251-270, vol. 54, No. 2, Institute of Electrical and Electronics Engineers.

Lam, "A Review of the Recent Development of MEMS and Crystal Oscillators and Their Impacts on the Frequency Control Products Industry," IEEE International Ultrasonics Symposium, Nov. 2008, pp. 694-704, Institute of Electrical and Electronics Engineers, Beijing, China.

Wang et al., "VHF free-free beam high-Q micromechanical resonators," Journal of Microelectromechanical Systems, Sep. 2000, pp. 347-360, vol. 9, No. 3, Institute of Electrical and Electronics Engineers.

Renata Melamud, "Temperature Insensitive Micromechanical Resonators," Dissertation for the Degree of Doctor of Philosophy, Dec. 2008, Chapter 4, pp. 72-119, Department of Mechanical Engineering, Stanford University, Stanford, California, USA.

Hsu et al., Stiffness-compensated temperature-insensitive micromechanical resonators, IEEE International Conference on Micro Electro Mechanical Systems, Jan. 2002, pp. 731-734, Institute of Electrical and Electronics Engineers.

Ouellet, "MEMS Integrated Design for Inertial Sensors," Webcast Presentation, Jun. 27, 2013, Teledyne DALSA Semiconductor.

Ghaffari et al., "Quantum Limit of Quality Factor in Silicon Micro and Nano Mechanical Resonators," Scientific Reports, Nov. 2013, Article No. 3244, vol. 3, Springer Nature.

Ng et al., "Stable pull-in electrodes for narrow gap actuation," Proceedings of IEEE 27th International Conference on Micro Electro Mechanical Systems (MEMS), Jan. 2014, pp. 1281-1284, Institute of Electrical and Electronics Engineers.

Candler et al., "Long-term and accelerated life testing of a novel single-wafer vacuum encapsulation for MEMS resonators," Journal of Microelectromechanical Systems, Dec. 2008, pp. 1446-11456, vol. 15, No. 6, Institute of Electrical and Electronics Engineers.

Khine et al., "12.9 MHz Lame-mode differential SOI bulk resonators," The 14th International Conference on Solid State Sensors, Actuators and Microsystems, Jun. 2007, pp. 1753-1756, Institute of Electrical and Electronics Engineers, Lyon, France.

Lee et al., "5.4-MHz single-crystal silicon wine glass mode disk resonator with quality factor of 2 million," Sensors and Actuators A: Physical, Feb. 2009, pp. 28-35, vol. 156, No. 1, Elsevier.

Ng et al., "An Etch Hole-Free Process for Temperature-Compensated High Q, Encapsulated Resonators," Solid-State Sensors, Actuators and Microsystems Workshop, Jun. 2014, pp. 99-100, Hilton Head Island, South Carolina, USA.

Merdassi et al., "Wafer Level Vacuum Encapsulated Capacitive Accelerometer Fabricated in an Unmodified Commercial MEMS Process," Sensors, Mar. 2015, pp. 7349-7359, vol. 15, No. 4, Multidisciplinary Digital Publishing Institute, Basel, Switzerland.

Tu et al., "Study on thermoelastic dissipation in bulk mode resonators with etch holes," IEEE Nano/Micro Engineered and Molecular Systems, Mar. 2012, pp. 478-482, Institute of Electrical and Electronics Engineers, Kyoto, Japan.

Yang et al., "Mechanical coupling of dual breathe-mode ring resonator," IEEE 17th International Conference on Sensors, Actuators and Microsystems, Jun. 2013, pp. 502-505, Institute of Electrical and Electronics Engineers, Barcelona, Spain.

Basu et al., "Microelectromechanical resonators for radio frequency communication applications," Microsystem Technologies, Aug. 2011, pp. 1557-1580, vol. 17, Spinger-Vertag.

Kim et al., "Encapsulated MEMS Resonators—A technology path for MEMS into Frequency Control Applications," Plenary Paper Abstract, IEEE International Frequency Control Symposium, Jun. 2010, Institute of Electrical and Electronics Engineers, Newport Beach, California, USA.

\* cited by examiner

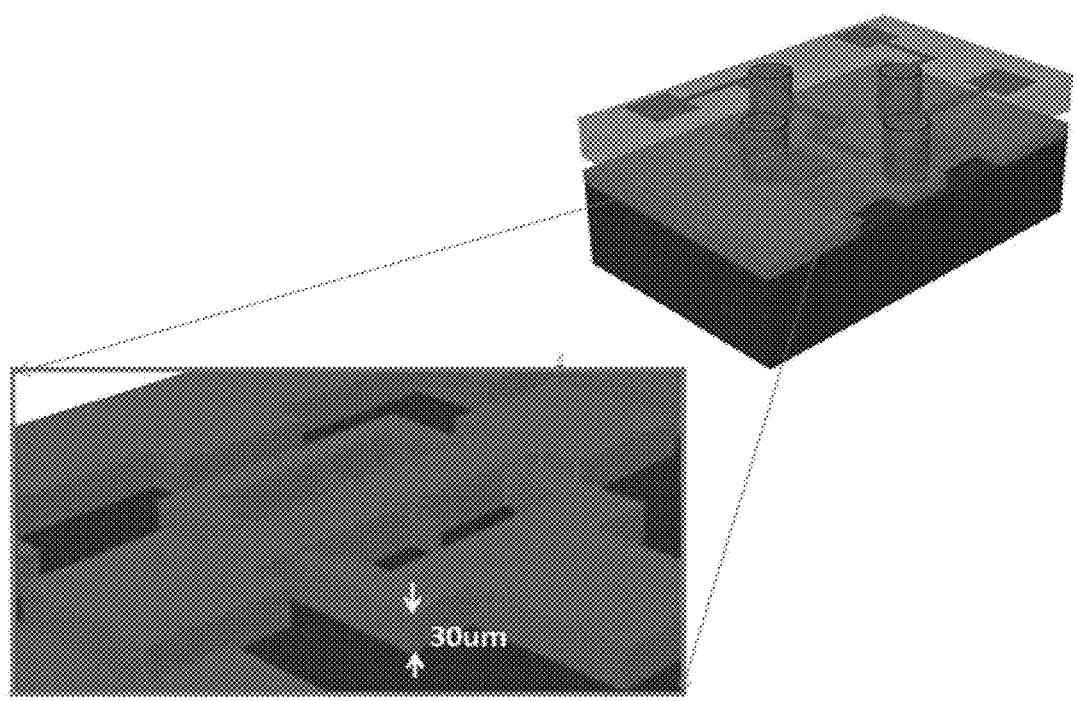
Figure 5
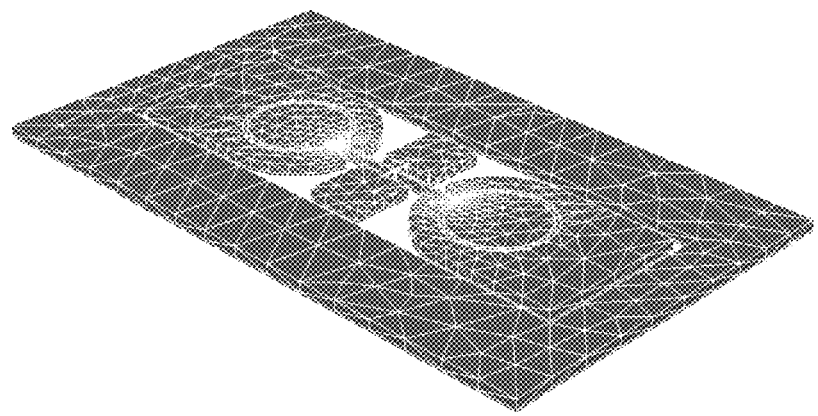
Figure 6
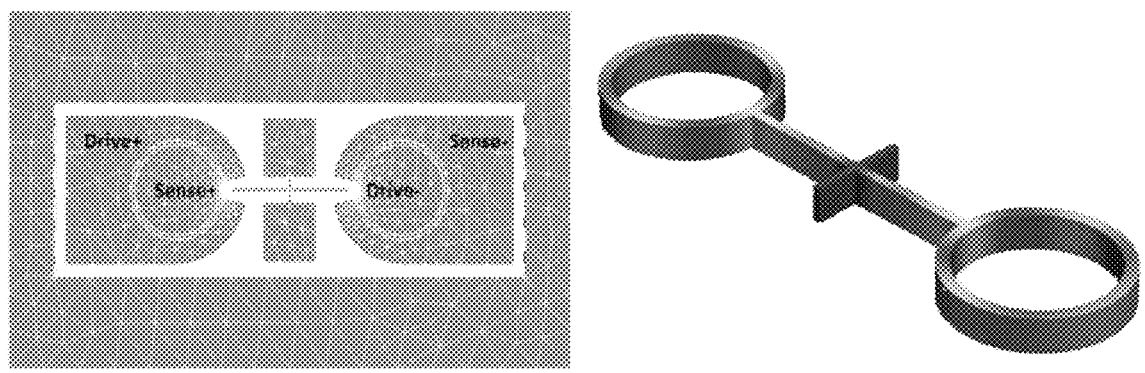

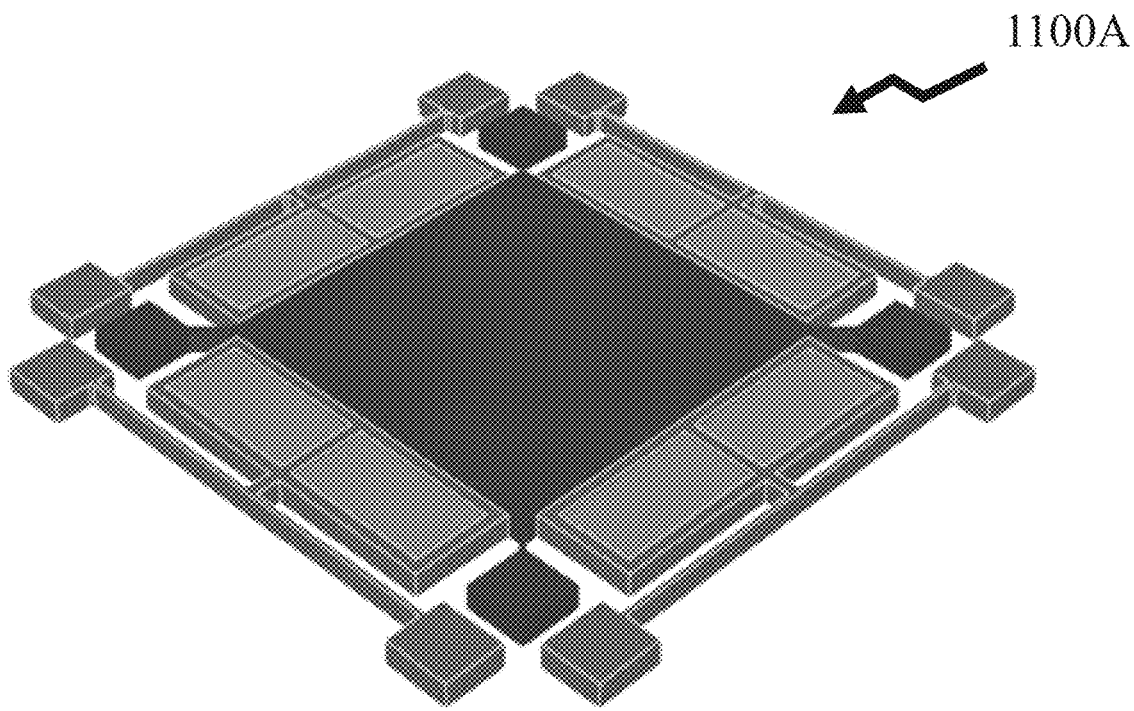
Figure 11
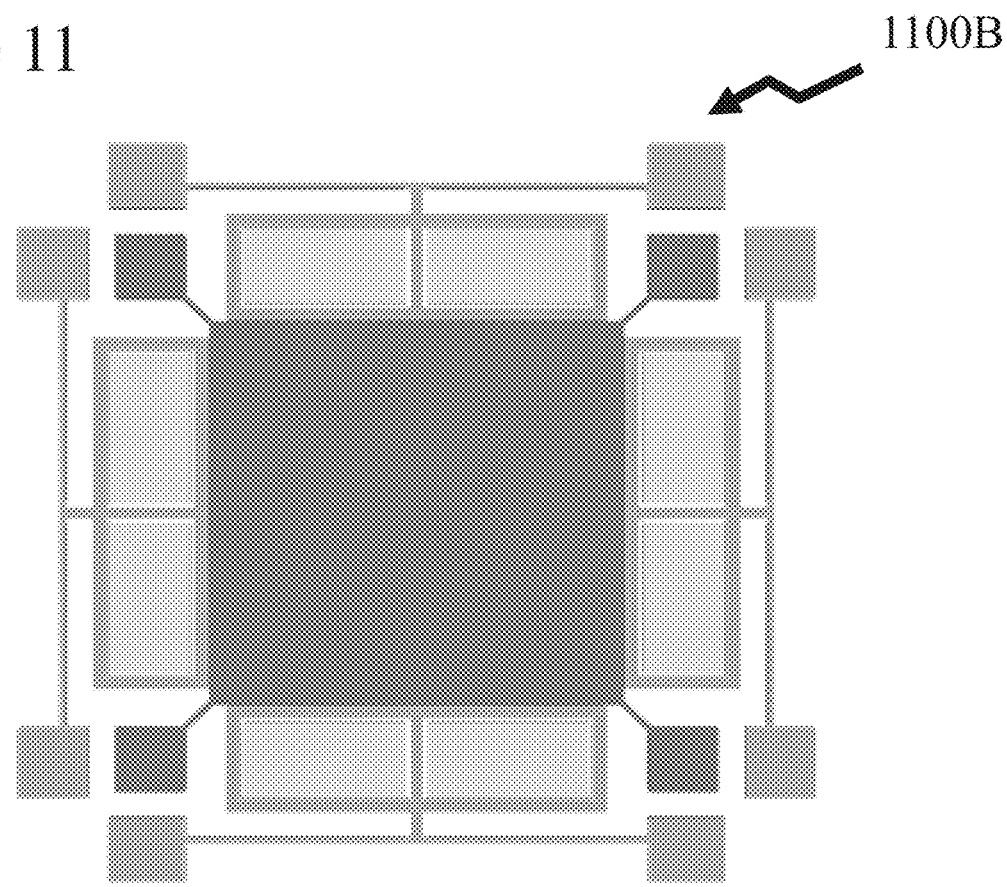

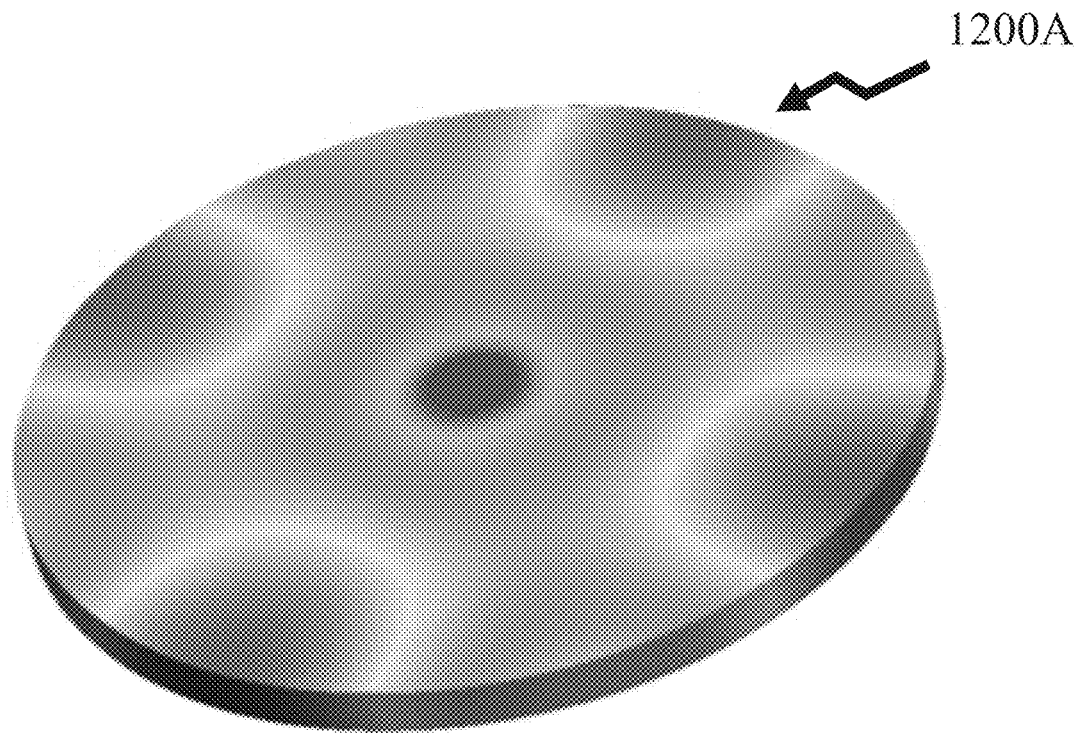
Figure 12
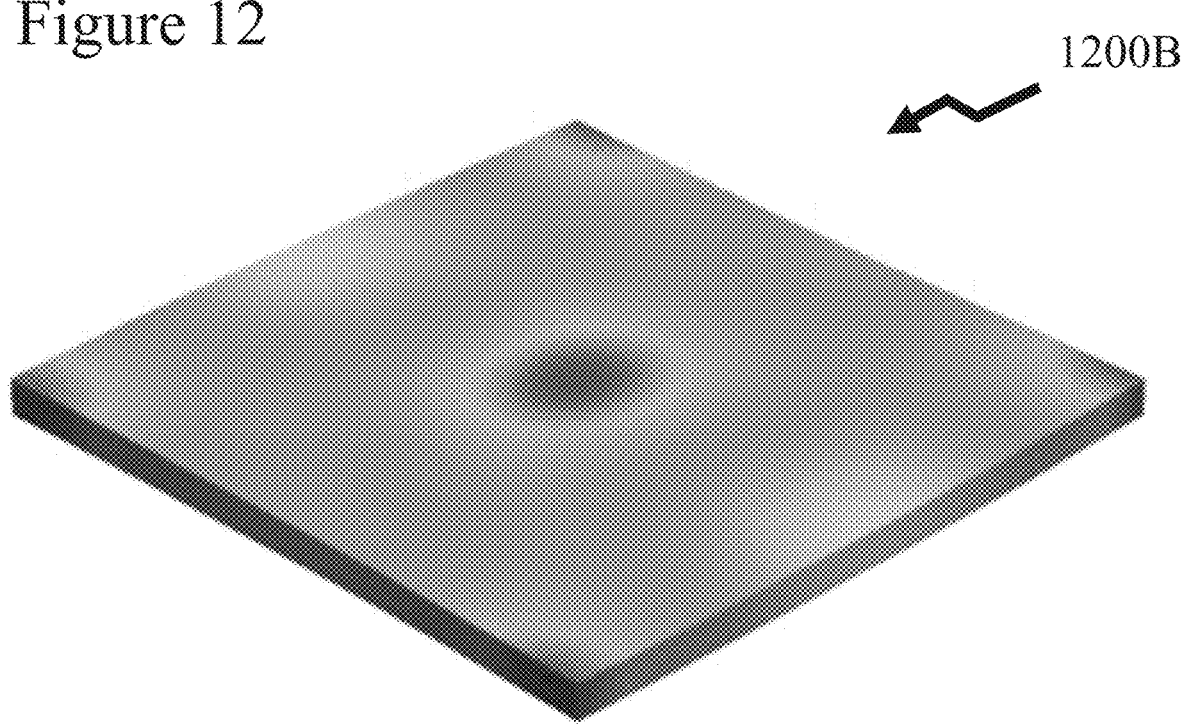

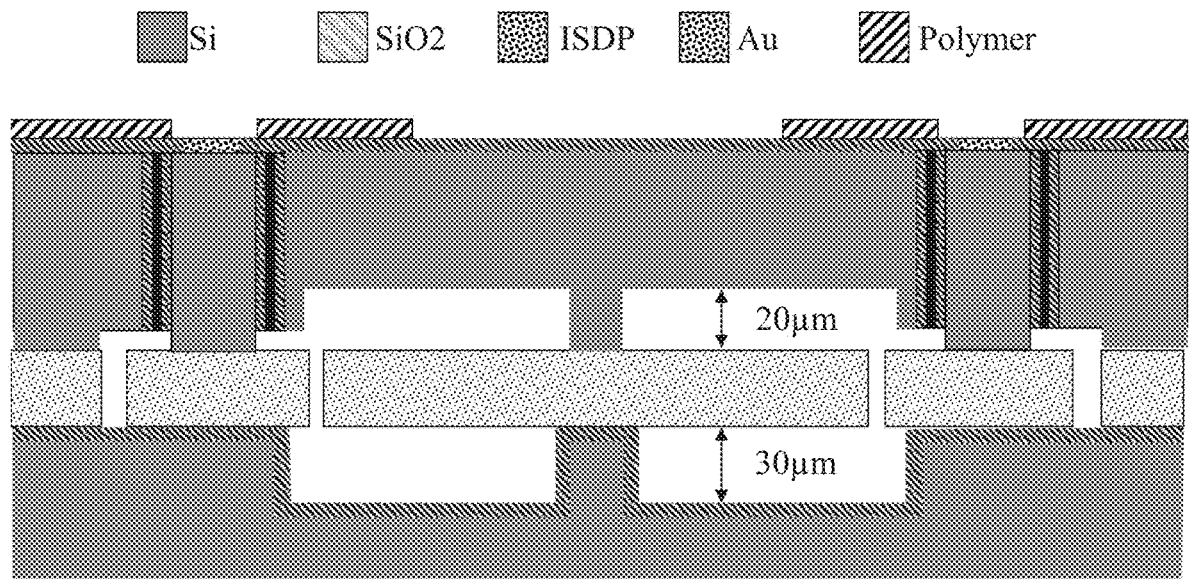
Figure 15
Figure 16
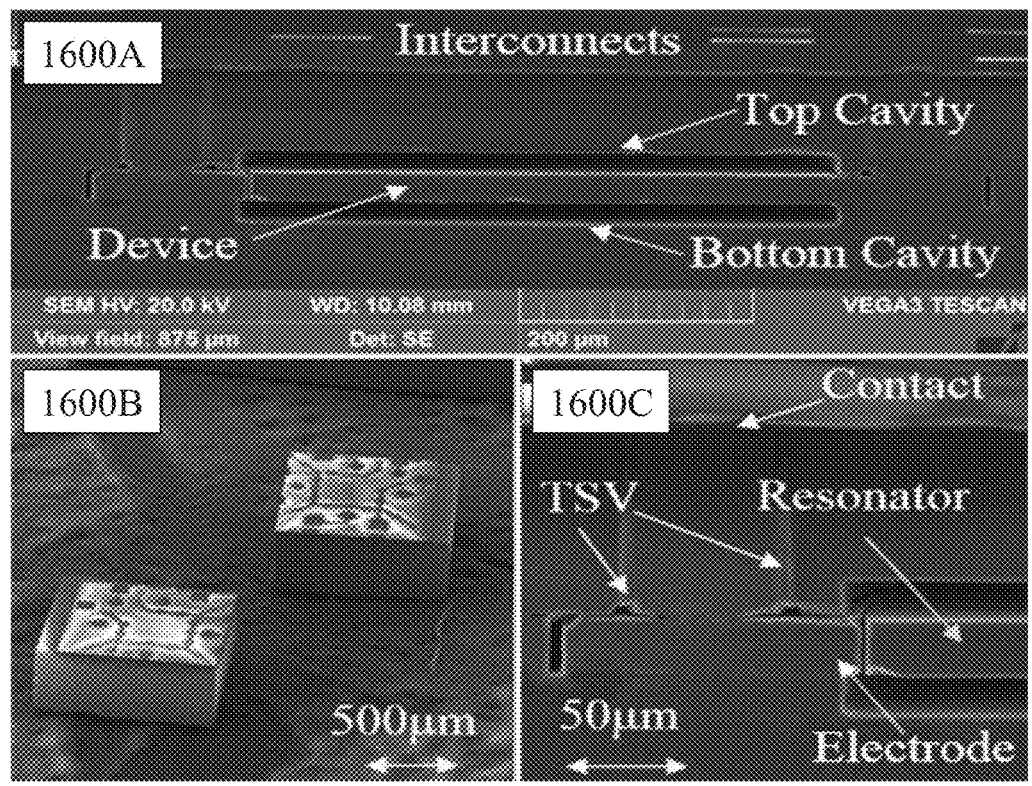

$f_0$=6.8953MHz

Q=3.24x10$^6$ $V_p$=40V

Power=-5dBm

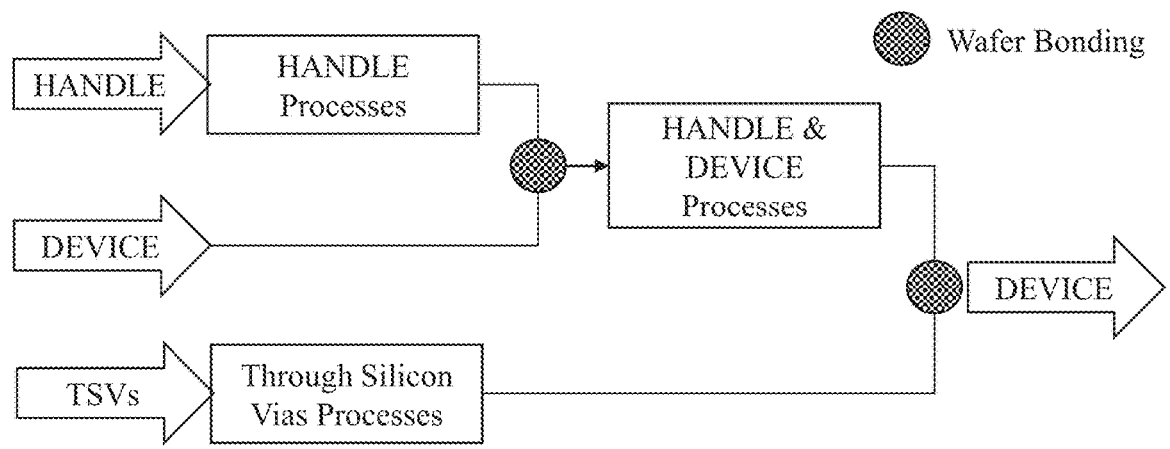
Figure 20A
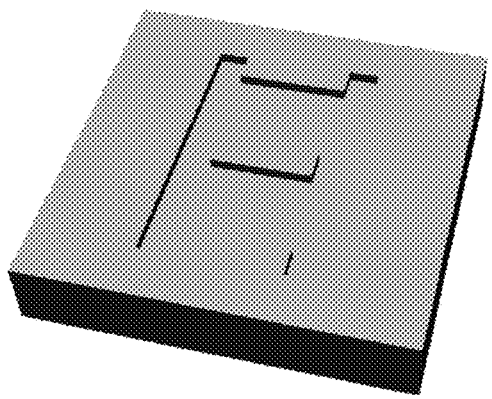
Figure 20B
Figure 20C
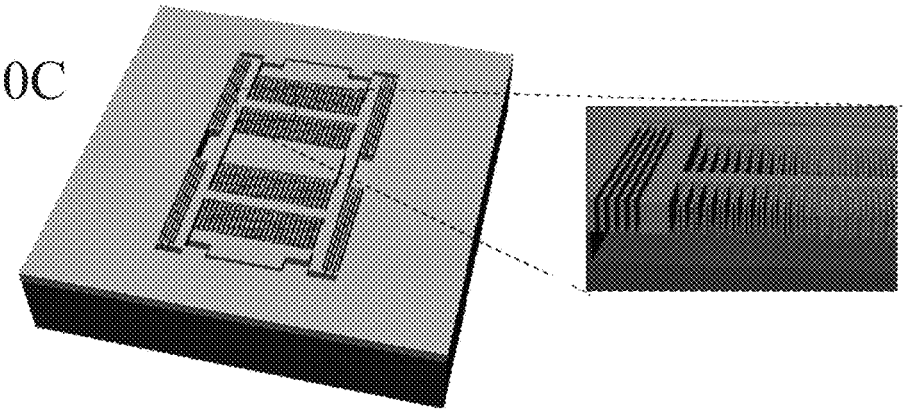

METHODS AND DEVICES FOR MICROELECTROMECHANICAL RESONATORS

CROSS-REFERENCE TO RELATED APPLICATIONS

This application is a continuation-in-part of U.S. application Ser. No. 16/369,757, filed Mar. 29, 2019, which is a continuation of U.S. application Ser. No. 14/790,220, filed Jul. 2, 2015, which claims priority to U.S. Provisional Application No. 62/020,049, filed Jul. 2, 2014. The foregoing applications are incorporated herein by reference in their entireties.

FIELD OF THE INVENTION

The present invention relates to MEMS sensors and more particularly to MEMS resonators which may be manufactured directly over or in conjunction with silicon based CMOS electronics.

BACKGROUND OF THE INVENTION

Microelectromechanical systems (MEMS) are small integrated devices or systems that combine electrical and mechanical components. The components can range in size from the sub-micrometer level to the millimeter level, and there can be any number, from one, to few, to potentially thousands or millions, in a particular system. Historically MEMS devices have leveraged and extended the fabrication techniques developed for the silicon integrated circuit industry, namely lithography, doping, deposition, etching, etc. to add mechanical elements such as beams, gears, diaphragms, and springs to silicon circuits either as discrete devices or in combination with integrated silicon electronics. Whilst the majority of development work has focused on silicon (Si) electronics additional benefits may be derived from integrating MEMS devices onto other existing electronics platforms such as silicon germanium (SiGe), gallium arsenide (GaAs) and, indium phosphide (InP) for RF circuits and future potential electronics platforms such as organic based electronics, nanocrystals, etc.

Within the field of radio frequency integrated circuits (RFIC) high quality filters, resonators, oscillators are required and typically must be implemented as bulky off-chip surface-acoustic wave (SAW) filters to achieve a satisfactory quality factor (Q-factor). Whilst current advances in MEMS technology have made it possible to implement such elements on-chip with a comparable Q-factor this is only achieved within the prior art through exploiting proper packaging techniques. Generally, these increase complexity, increase costs, and reduce yields as mechanical/physical sealing of the fabricated MEMS/MEMS-CMOS circuit is required. This is because the Q-factor of a MEMS resonating device is strongly dependent on the level of vacuum in its environment as reducing pressure minimizes air resistance, resulting in reduced damping of the mechanical structure's vibration.

However, the resonating elements of the MEMS are anchored to the substrate which yields anchor damping losses arising from the transfer of kinetic energy from the resonator to its support structure. Mechanical vibrations within a MEMS travel as acoustic or elastic waves which when they impinge upon an interface, such as the resonator—anchor interface then these waves may either be reflected or couple through the interface to the substrate. Those elastic waves that couple to the substrate are lost and hence are an energy loss mechanism for the resonator. Anchor damping can impose considerable losses in MEMS resonators and thus dramatically affect the quality factor. Accordingly, it would be beneficial to reduce anchor damping losses in order to improve the Q factor of resonating MEMS elements.

MEMS resonators are mechanical structures which in order to operate require an electrical input. Their output is a mechanical vibration which is converted into an electrical signal in order to be "sensed" and subsequently utilized. There are several transduction mechanisms that convert mechanical energy into electrical energy and in many instances the choice of the transduction mechanism is an important deciding factor in the MEMS resonator design. Electrostatic and piezoelectric transduction mechanisms are most commonly used due to the ease of fabrication and excellent performance of the designs. However, alternative methods based on optical and magneto-motive transduction do exist, and have met success.

Within the prior art relating to electrostatic transduction significant focus has been made in respect of surface micromachining and reducing the gaps between the actuating electrodes and the sensing electrodes. This focus being due to the fact that the electrostatic coupling coefficient is inversely proportional to the square of the gap. Accordingly, over the past decade many implementations that required DC biases of 150-200V, which is impractical for commercial consumer electronics, have become commercially viable as research on surface micromachining led to gap reduction to dimensions significantly smaller than 1 µm, in some instances down to 30 nm. However, in this design process the electrostatic transduction area has been also limited by the thickness of the material, especially where the resonator is laterally driven, that can be processed at these small dimensions). This being addition to reduced fabrication yields and in many instances use of fabrication processes that were not amendable to mass-production.

Accordingly, it would be beneficial to establish resonators exploiting a combination of bulk and surface micromachining processes so that whilst the gaps are increased to facilitate manufacturing with high yield the increased thickness of the resonating elements results in the transduction area being significantly increased allowing bias voltages to be reduced to voltages compatible with high volume low cost consumer electronics.

However, in essentially all applications, the important considerations for selecting a MEMS sensor include:
Accuracy;
Repeatability;
Long-term stability;
Ease of calibration;
Size;
Packaging; and
Cost effectiveness.

MEMS sensors require electronic circuits to either provide excitation and/or bias signals, as in the instance of MEMS resonators, or to convert the MEMS sensor output to a signal for use by other electronics. Silicon CMOS electronics has become the predominant technology in analog and digital integrated circuits. This is essentially because of the unparalleled benefits available from CMOS in the areas of circuit size, operating speed, energy efficiency and manufacturing costs which continue to improve from the geometric downsizing that comes with every new generation of semiconductor manufacturing processes. In respect of MEMS systems, CMOS is particularly suited as digital and analog circuits can be designed in CMOS technologies with very low power consumption. This is due, on the digital side, to the fact that CMOS digital gates dissipate power predominantly during operation and have very low static power consumption. This power consumption arising from the charging and discharging of various load capacitances within the CMOS gates, mostly gate and wire capacitance, but also transistor drain and transistor source capacitances, whenever they are switched. On the analog side, CMOS processes also offers power savings by offering viable operation with sub-1V power supplies and with µA-scale bias currents.

Accordingly, it would be beneficial whilst designing MEMS resonators and absolute pressure sensors it would be beneficial to establish their designs such that they are compatible with combining the CMOS and MEMS technologies into a single integrated circuit. It would be further beneficial for the processes of manufacturing MEMS resonators and absolute pressure sensors to support the integration of other capacitive sensors for other measurands within a single die and for the MEMS elements to be implemented directly atop silicon CMOS electronics (i.e. above integrated circuits, or above-IC) thereby minimizing footprint, cost, and parasitics.

Other aspects and features of the present invention will become apparent to those ordinarily skilled in the art upon review of the following description of specific embodiments of the invention in conjunction with the accompanying figures.

SUMMARY OF THE INVENTION

It is an object of the present invention to mitigate limitations within the prior art relating to MEMS sensors and more particularly to MEMS resonators which may be manufactured directly over or in conjunction with silicon based CMOS electronics.

In accordance with an embodiment of the invention there is provided a MEMS device comprising a membrane formed within a device layer, an upper cavity formed within a top layer, and a lower cavity formed within a handling layer.

In accordance with an embodiment of the invention there is provided a method comprising forming a lower cavity within a handling layer, bonding a device layer to the handling layer, processing the assembled device and handling layers in order to form a membrane within the device layer which is released from the device and handling layers, forming an upper cavity within a top layer, and bonding the top layer to the assembled device and handling layers within a predetermined pressure environment in order to seal the membrane within a cavity formed by the upper cavity and the lower cavity.

In accordance with an embodiment of the invention there is provided a MEMS device comprising a disk resonator and a plurality of ring resonators deployed around the periphery of the disk resonator, wherein each ring resonator is coupled to the disk resonator by a short beam and the disk resonator acts as the anchor for each ring resonator of the plurality of ring resonators.

In accordance with an embodiment of the invention there is provided a MEMS device comprising:
a first electrode having a first edge;
a second moveable electrode having a second edge disposed opposite the first edge and an inner open region;
a stop disposed within the inner open region of the second electrode positioned to stop the second edge of the second moveable electrode at a predetermined separation from the first edge of the first electrode when the second moveable electrode is pulled towards the first electrode under electrostatic actuation; and
at least one welding pad of a plurality of welding pads disposed on a second edge of the second moveable electrode on the inner open region engaging against the stop, wherein the at least one welding pad of a plurality of welding pads is dimensioned to short the second electrode to the stop and melt fusing the second electrode to the stop during the pulling in such that the resulting electrode gap between the first edge and the second edge is smaller than the minimum resolvable gap of the MEMS fabrication process employed to form the electrodes as part of the MEMS device.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein:

FIG. 5 depicts a free-free beam resonator according to an embodiment of the invention;

FIG. 6 depicts a 2-ring breathing-mode resonator according to an embodiment of the invention;

FIG. 11 depicts the movable electrode configuration depicted in FIG. 10 applied to a square Lamé mode resonator according to an embodiment of the invention;

FIG. 12 depicts the wine-glass mode of a disk resonator and Lamé mode of a square resonator with resonators anchored at the central nodal point according to embodiments of the invention;

FIGS. 15 and 16 depict cross sectional schematic and SEM images of Lamé resonators according to embodiments of the invention and packaged encapsulated die as manufactured upon a commercial MEMS fabrication process line;

FIGS. 20A to 20E depict a process flow for fabricating MEMS resonators according to embodiments of the invention exploiting a commercial MEMS fabrication process line.

DETAILED DESCRIPTION

The present invention is directed to MEMS sensors and more particularly to MEMS resonators which may be manufactured directly over or in conjunction with silicon based CMOS electronics.

The ensuing description provides exemplary embodiment(s) only, and is not intended to limit the scope, applicability or configuration of the disclosure. Rather, the ensuing description of the exemplary embodiment(s) will provide those skilled in the art with an enabling description for implementing an exemplary embodiment. It being understood that various changes may be made in the function and arrangement of elements without departing from the spirit and scope as set forth in the appended claims.

MEMS Resonator

Modern consumer electronic devices impose stringent requirements of low cost, low assembly complexity, compact system integration, high functionality, and low power consumption. Accordingly, MEMS resonators which offer reduced production costs through batch manufacturing leveraging silicon integrated circuit design and manufacturing methodologies have been of significant interest due to the potential for removing the requirement for separate crystal oscillator components. Over the past 50 years since their first demonstration in 1967 significant research focus has been applied to MEMS resonators. However, MEMS after an initial wave of optimism had to wait for manufacturing advances, commercial requirements, and technological breakthroughs to realize their potential with effective designs, stable performance, and efficient operation. Such technological breakthroughs include, but are not limited to, anchor damping, gas damping, thermoelastic dissipation, thermal expansion and the thermal coefficient of elasticity.

In general a MEMS resonator may be represented mechanically as a mass-spring-damper second order system wherein the spring and mass are used to describe the oscillation while the damper is used to describe the energy losses. The resonant frequency, $f_0$, of such a system can be found from Equation (1) where, k represents the spring constant and m the mass of the resonating structure. The damper within the mass-spring-damper second order system according to its magnitude whilst reducing, restricting or preventing its oscillations defines the overall system as being overdamped, critically damped, underdamped, or undamped. Accordingly, from this simplified perspective view the frequency of operation can be controlled by changing the spring constant and/or mass of the resonating structure.

$$f_0 = \frac{1}{2\pi}\sqrt{\frac{k}{m}} \qquad (1)$$

Figure 1:
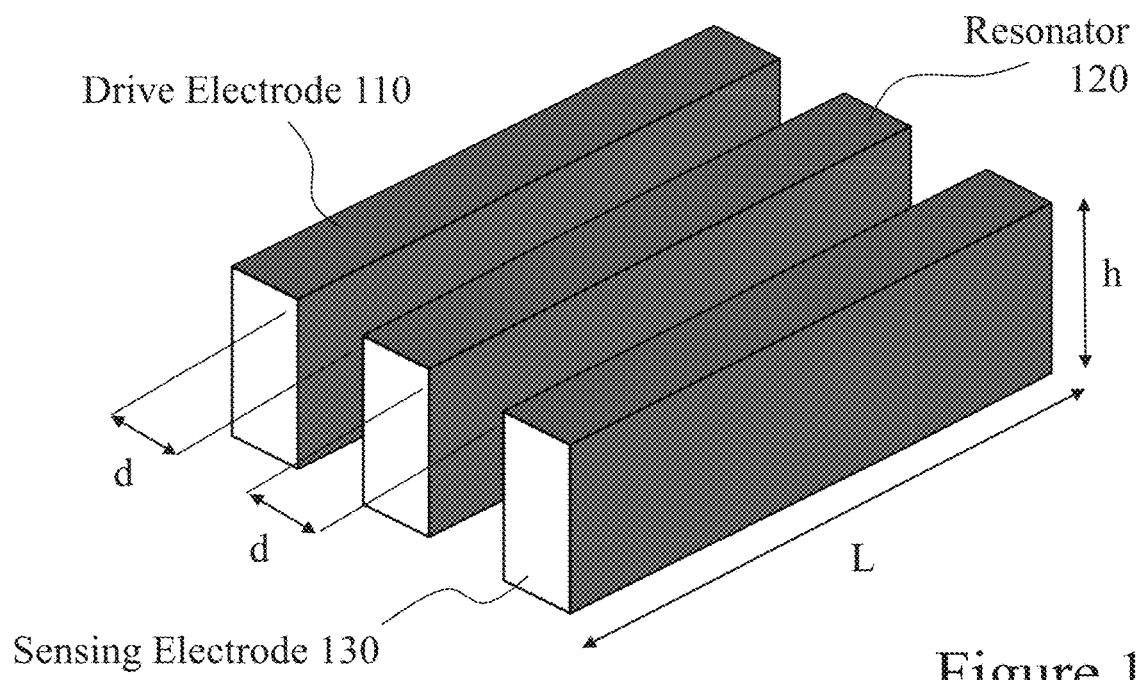
FIG. 1 depicts a simple model for an electrostatically driven MEMS resonator.

As noted supra a resonator has an output which is a mechanical vibration which is converted into an electrical signal in order for it to be "sensed" and subsequently utilized which is generated in dependence upon an electrical input signal. Whilst there are different transduction mechanisms that convert mechanical energy into electrical energy electrostatic and piezoelectric transduction mechanisms are the most commonly used due to their relative ease of fabrication and performance. In general, MEMS resonators based on electrostatic transduction offer advantages including high quality factor, low phase noise, low power consumption and very low space requirements. MEMS resonators that are based on electrostatic transduction are usually composed of a semi-free moving structure, an actuating electrode and a sensing electrode. A simplified model of an electrostatically driven MEMS resonator is depicted in FIG. 1 comprising a drive electrode 110, resonator 120, and sensing electrode 130. A sinusoidal signal at the drive electrode 110 is used to drive the resonator 120 into oscillation at its natural frequency of vibration. The mechanical displacement causes a change in the capacitance of the space between the sensing electrode and the resonating structure. This variation of the capacitance causes an output current at the sensing electrode 130. The electrical signal that is produced has the same frequency as the natural mechanical frequency of the vibrating structure.

The electrostatic coupling coefficient, η, which defines the efficiency of the electrostatic transduction for a simple electrostatically driven resonator such as that depicted in FIG. 1, for example, is defined by Equation (2) where C is the capacitance between the resonating structure and the sensing electrode, $V_P$ is the DC potential difference between the bias electrode(s) and the resonating structure, A is the electrode overlap area, $\varepsilon_r$ is the relative permittivity of the material between the structures, and d is the transducer gap.

$$\eta = V_p \frac{\delta C}{\delta x} = \varepsilon_r \frac{V_r A}{d^2} \qquad (2)$$

A number of important points can be extracted from Equation (2). The first to note is that η is inversely proportional to the square of the transducer gap, d. Because of the exponential nature of this relationship then the transducer gap is typically designed to be as small as possible within the limits of the microfabrication process employed. Thus, a series of attempts have been made to reduce it to several tens to few hundreds of nanometer levels. The limitations of etching and photolithography have led researchers to employ innovative fabrication methods. In particular, the most common technique involves depositing an exceptionally thin film of silicon dioxide between the structures. The film is then etched away with dry or wet etching, leaving in place an approximately 100-200 nm gap, see for example Nabki et al. in "A Highly Integrated 1.8 GHz Frequency Synthesizer Based on a MEMS Resonator" (IEEE J. Solid-State Circuits, Vol. 44, pp. 2154-2168). Another point to be noted from Equation (2) is that the electrostatic efficiency depends on the potential voltage, $V_P$, across the structure providing designers with a tool to control the operation of the resonator. Accordingly a 0V bias voltage will switch off the device completely and reduce the power consumption to effectively 0W which can be extremely important in portable electronic devices where power efficiency is of the outermost importance.

Setting $V_P$ to a high bias voltage leads to an increase in the electrostatic efficiency. However, there are a number of limitations that restrict the use of a high $V_P$. First, most electronic devices operate at a voltage range of 1.8V to 15V, anything beyond that is largely overlooked by commercial manufacturers. Second, high bias voltages cause the devices to exhibit high non-linearity, leading to increased phase noise and a reduced quality factor.

A. Quality Factor and Energy Losses

Resonating systems can be defined to a large degree by two parameters, the resonant frequency, $f_0$ and the quality factor, Q. The resonance frequency is the frequency at which the device exhibits higher amplitudes of vibration compared to other frequencies. The quality factor is defined by Equation (3) which is a dimensionless parameter that characterizes a resonator's operation from two perspectives. First, it provides information regarding its efficiency as a high Q indicates that the oscillations will die slowly and that there is little energy lost during the periodic oscillation. Second, it provides information regarding the relation of the resonator's bandwidth and center frequency as Equation (3) may be rewritten as Equation (4) where $\Delta f$ is the half-power bandwidth. A high Q is associated with very high selectivity, small $\Delta f$, which is very desirable in RF filters.

$$Q = 2\pi \frac{EnergyStored}{EnergyDissipatedPerCycle} \quad (3)$$

$$Q = \frac{f_0}{\Delta f} \quad (4)$$

Importantly, the Q of a resonator is highly dependent on the frequency of operation. In general, it is more difficult to achieve high-Q at very high frequencies (VHF) as anchor damping, thermoelastic dissipation and material non-linearities become increasingly harder to counter. As such, the Q–f product is very commonly seen in the literature because it incorporates the frequency dependency and allows for a more "fair" comparison of the various resonator designs. As is the case for a physical resonator, a MEMS resonator slowly loses energy to the surrounding environment. The usual macroscopic energy loss mechanisms such as air damping and anchor damping remain in MEMS devices. However, the micro dimensions and the small energies involved emphasize the importance of energy loss mechanisms that were previously not important, such as, the thermoelastic dissipation and surface losses. The final quality factor of a MEMS resonator device can be found by adding the individual contributions of each factor according to Equation (5).

$$\frac{1}{Q_{total}} = \frac{1}{Q_{anchor}} + \frac{1}{Q_{gas}} + \frac{1}{Q_{TED}} + \frac{1}{Q_{surface}} \quad (5)$$

A.1. Gas Damping:

Gas damping describes the transfer of kinetic energy from the resonator to the surrounding air. In electrostatic transduction resonators air damping is the dominant energy loss mechanism after anchor damping, when operated at near atmospheric level pressures. Typically, the small gap between the input-output electrodes and the resonator gap, as well as the high vibration speeds involved, introduces significant Couette flow damping, see for example Kaul in "Microelectronics to Nanoelectronics: Materials, Devices & Manufacturability" (CRC Press). Further, with very narrow gaps at the sub-micron level, other more complicated mechanisms, such as squeeze film damping, can cause further reductions in the Q of the resonators, see for example Kun. Because of this electrostatic MEMS resonators are generally operated in vacuum or very low pressure environments. Under these conditions the remaining air behaves as kinetic particles rather than a continuous medium.

A.2. Anchor Damping:

Anchor damping describes the transfer of kinetic energy from the resonator to its support structure. Mechanical vibrations travel at the speed of sound within the medium of the resonator through waves known as elastic waves. When these waves meet the resonator/anchor interface then these elastic waves may either get reflected or traverse through to the substrate. Elastic waves traversing to the substrate are lost as is the energy that they contain. As a result, anchor damping can impose considerable losses in MEMS resonators and thus dramatically affect the quality factor. However, using techniques from other electromagnetic wave systems researchers have exploited impedance matching techniques, such as quarter-wavelength matching, to reduce this loss mechanism.

B: Resonator Developments According to Embodiments of the Invention

Figure 2:
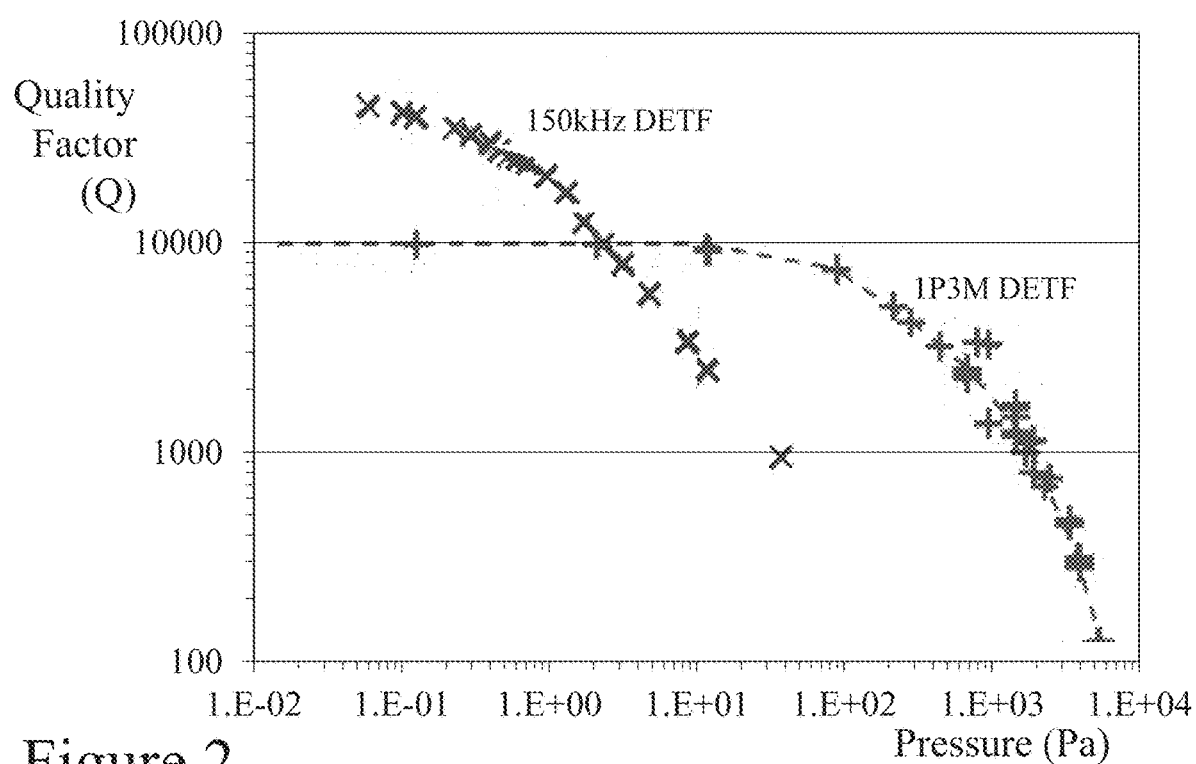
FIG. 2 depicts the effect of pressure upon MEMS resonators.

According to embodiments of the invention the inventors address the loss mechanisms within MEMS based resonators, including:

B1. Air Damping Losses:

Within the prior art MEMS resonators are typically packaged within an external package under vacuum or low pressure as part of an overall silicon circuit or an assembly such as a system-in-package, system-on-a-chip, etc. Such packages, may include, but are not limited to, hermetic metal/glass using typically Kovar™ with glass-seal electrical feed throughs, and hermetic ceramic packages using typically lead frames embedded in a vitreous paste between ceramic top and bottom covers. In some prior art approaches encapsulation of the MEMS is performed through wafer-scale thin film encapsulationor through vacuum micro-cavities formed through van der Waals bonding of silicon and/or borosilicate glass). As evident from FIG. 2 the quality factor of a MEMS resonator is not limited by gas damping at pressures below 10Pa, see for example Hopcroft in "Temperature-Stabilized Silicon Resonators for Frequency References" (PhD Dissertation, Mechanical Engineering, Stanford University, 2007). Accordingly, it is desirable to fabricate MEMS resonators through a commercial MEMS process line that supports wafer level encapsulation such that large numbers of MEMS resonators can be simultaneously packaged at very low pressures, i.e. ~10 mTorr (~1.5 Pa), as achieved on the MEMS Integrated Design for Inertial Sensors commercial MEMS process line of Teledyne DALSA Inc.

B2. Electrostatic Transduction—DC Bias:

Within the prior art the resonators found in the literature concentrate on surface micromachining and reducing the transduction gaps between the actuating electrodes and the sensing electrodes. As evident from Equation (2) the electrostatic coupling coefficient is inversely proportional to the square of the gap such that many implementations require DC biases of 150-200V, which is impractical for commercial consumer electronics applications. Accordingly, the past decade therefore research has tended to concentrate on exploiting surface micromachining techniques to further reduce the gaps to dimensions significantly below 1 μm. However, these techniques limit the electrostatic transduction area as the process constraints for fabricating these narrow gaps leads to limits for the material thickness being etched. Such limitations are particularly important especially if the resonator is laterally driven but have led to low bias voltages low through gaps as low as 30 nm. However, these techniques have led to low fabrication yields and are not amicable to mass-production.

According to embodiments of the invention the MEMS resonators are differentiated in the combination of bulk and surface micromachining processes. The minimum gap is approximately 1.5 μm but the devices are approximately 30 μm thick and laterally driven. Accordingly, the transduction area A is massively increased with respect to prior art MEMS resonators allowing the bias voltage to be reduced to approximately 5V whilst the larger electrode gaps lead to high manufacturing yields.

B.3. Anchor Losses:

Embodiments of the invention exploited impedance matching techniques to address anchor losses.

B.4. Electronics Compatibility:

Embodiments of the invention exploit manufacturing techniques that are compatible with silicon CMOS.

B.5. Packaging:

Embodiments of the invention exploit multi-layer device implementation and packaging as described below allowing localized encapsulation of the MEMS devices with high vacuum levels to be achieved yielding high Q levels to be achieved.

C. Resonator Device Designs

C.1. Resonant Frequency Tuning of Bulk Mode MEMS Resonator

Within prior art resonators a change in the DC bias introduces a frequency shift in the resonant frequency of the element, a phenomenon referred to as electrostatic spring softening. A voltage difference between the electrodes and the resonating mass will introduce an electrostatic force $F_E$ according to Equation (6), where C is the capacitance, V is the voltage and d is the distance between the two parallel plates. This electrostatic force is applied on the resonant mass, pushing it or pulling away from the, generally, fixed driving and sensing electrodes. This effect induces a strain across the structure, which will affect the resonant frequency according to Equation (1). A change in the applied voltage will change the applied force, which in turn will affect the resonant frequency of the device.

$$F_E = \frac{1}{2}\frac{C}{d}V^2 \qquad (6)$$

This dependency has been exploited and is currently used to provide programmable resonators (oscillators) wherein the resonant frequency is electrically tuned through the DC bias. However, a drawback with this approach is that the output current of the resonator is also depended on the DC bias voltage. When the DC bias is changed, the overall frequency response of the device is affected not just the resonant frequency, and this introduces two challenges. First, when the DC bias is reduced the motional resistance is exponentially increased. In order for the device to continue operating as an oscillator, the amplifier's gain in the negative feedback loop needs to be increased accordingly. Second, when the DC bias is increased past a certain threshold, the resonator begins operating in an unpredictable non-linear regime.

The method inventive described below can be used to set, tune or adjust the output frequency of a MEMS resonator without affecting the output current. Whilst the discussion that follows, refers to a square Lamé mode resonator the method may be applied to essentially any suitable resonating element provided that it has sufficient actuation space on the top or bottom surface. The device consists of the classic square Lamé mode resonator that is sensed and actuated using a fully differential setup such as that depicted in FIG. 3. As depicted the square Lamé mode resonator has a pair of drive electrodes denoted by D+/D− and a pair of sense electrodes S+/S− disposed around its periphery whilst the resonator body itself is DC biased through a contact at an anchoring point, in this instance the corners.

A square resonator mass is anchored in 4 corners using Finite Element Method (FEM) optimized anchors. Two electrodes are used to provide two drive signals that are 180° out of phase to the D+/D− electrodes. Another set of electrodes, S+/S−, are used to collect the two out of phase output signals and recombine them. The bias voltage is provided to the resonating mass using a fifth electrode. Typically this would be used for frequency tuning; for the purposes of this specification this will be referred to as the legacy configuration or model.

Figure 4A:
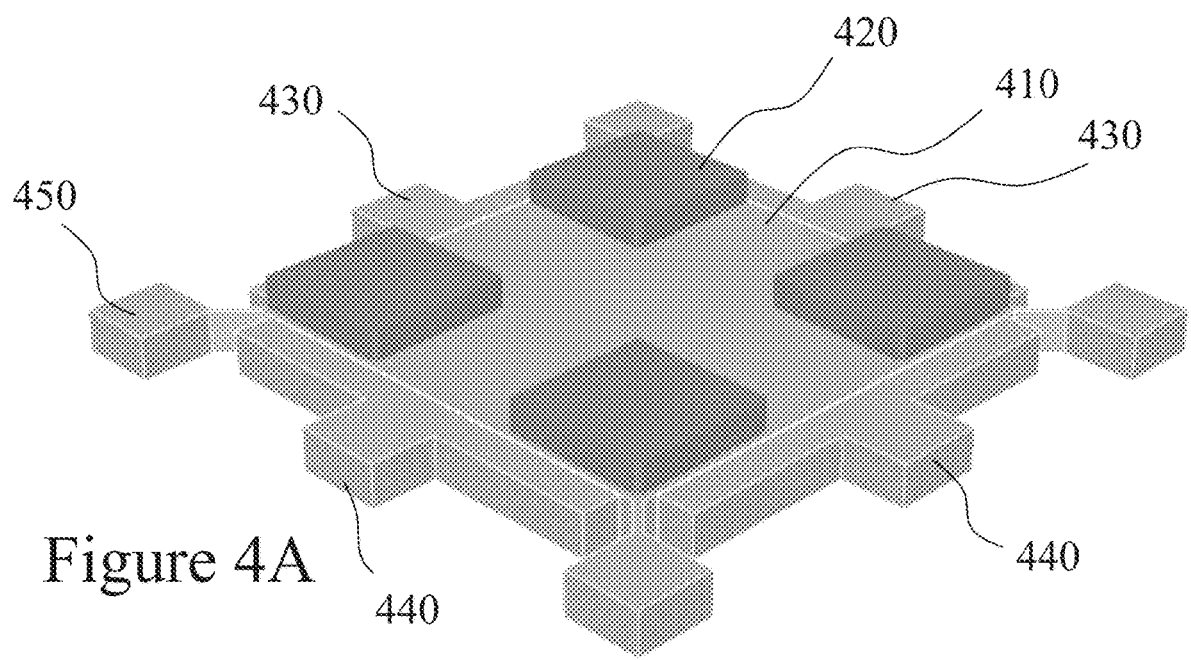
FIG. 4A depicts a differential measurement setup for a Lamé mode resonator according to an embodiment of the invention.

The inventors novel methodology is based upon the introduction of additional electrodes on the top or bottom side of the resonator that are independent of the DC bias, as illustrated in FIG. 4A with contacts 420 disposed in the corners of the square resonator disk 410 and independent from the drive electrodes 430, sense electrodes 440 and bias electrode 450. Different configurations with different electrode arrangements may be implemented without departing from the scope of the invention.

The inventors have identified advantages of the inventive design methodology including, firstly, that the use of several tuning electrodes allows for the introduction of complex strains on the resonant structure that were previously unachievable. For the purposes of this specification, complex strains refers to strains that are not uniform in direction but rather spread in different directions and interfere constructively or destructively across the structure. As discussed previously the prior model of frequency tuning yields a dependency on the DC bias which is linear. In contrast, embodiments of the invention, with complex strain, implemented by using sets of different electrodes can introduce exponential or polynomial dependency of resonator frequency with DC tuning voltages applied. Additionally, each tuning electrode is independent and its voltage can be set separately, effectively allowing for high tuning resolution.

Amongst the applications for such inventive tuning methodology is temperature compensation. This is because the resonant frequency of silicon resonators decreases according to a quadratic formula as the temperature increases. Accordingly, a multiple electrode configuration may be established that yields a tuning configuration that could completely or significantly null the resonant frequency temperature dependence. Hence, a linear sensing of the temperature may yield a linear DC bias variation with temperature that generates a quadratic frequency offset to compensate for the temperature dependent frequency offset.

A second advantage for such inventive tuning methodology is that the frequency tuning range dramatically increases compared to the prior art configuration. This is because there is effectively no upper or lower limit imposed by non-linearity and the motional impedance of the device. The tuning voltage can be positive, negative or zero depending on the tuning configuration that needs to be implemented.

A third application for additional electrodes on the top or bottom side of the resonator is actuation and sensing of an out-of-plane mode of the resonator. For example, in FIG. 4A, two of the electrodes 420 in the second layer could be used as drive electrodes, D+/D−, to actuate the torsional mode of the resonator, while the other two electrodes, S+/S−, are used to sense the resulting motion. The resonator body itself is DC biased using the same contact that is used for the in-plane mode.

Actuation and Detection

Figure 3:
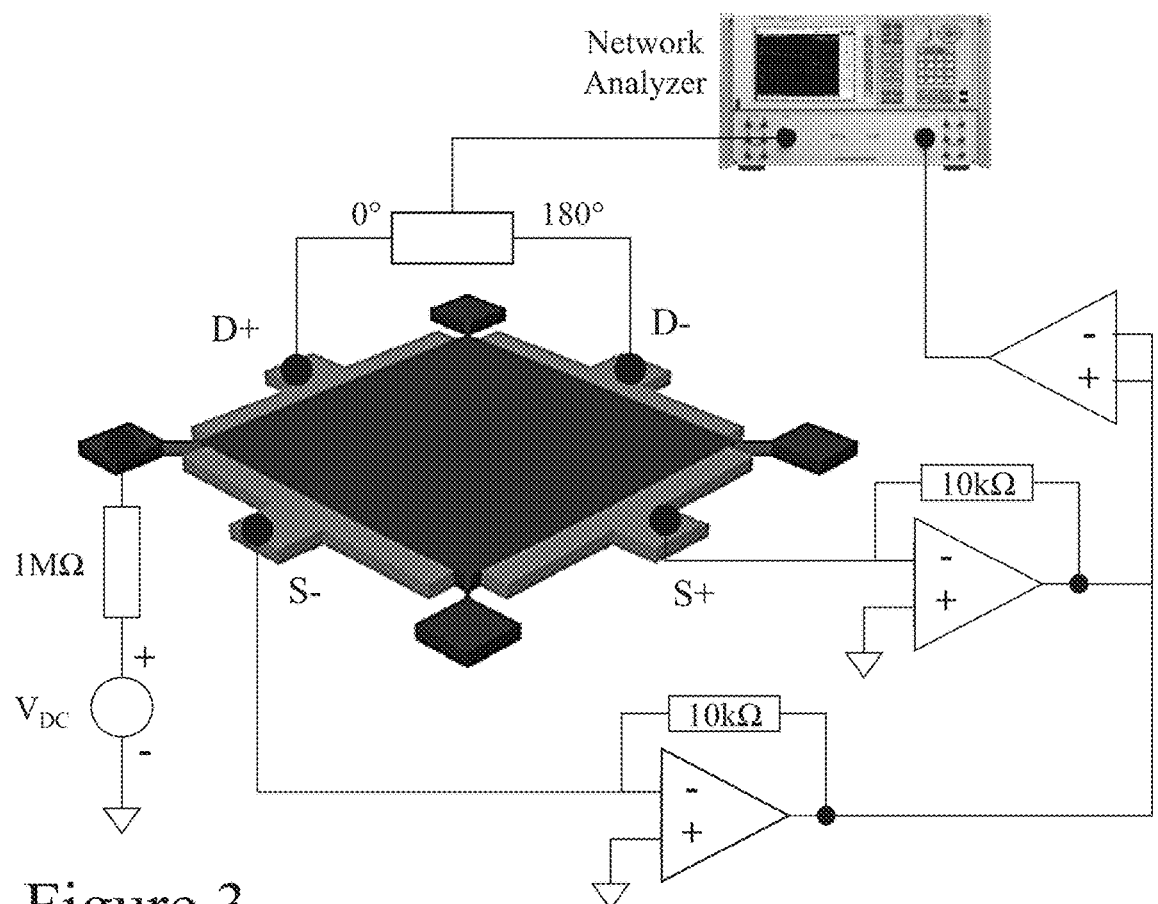
FIG. 3 depicts a differential measurement setup for a Lamé mode resonator.

In one embodiment of the system, the in-plane Lamé mode is actuated using a differential configuration as shown in FIG. 3. Two electrodes are used to provide two drive signals that are 180 degrees out of phase to the D+/D− electrodes. Another set of electrodes, S+/S−, are used to collect the two out of phase output signals and recombine them. The bias voltage is provided to the resonating mass using a fifth electrode.

Figure 4B:
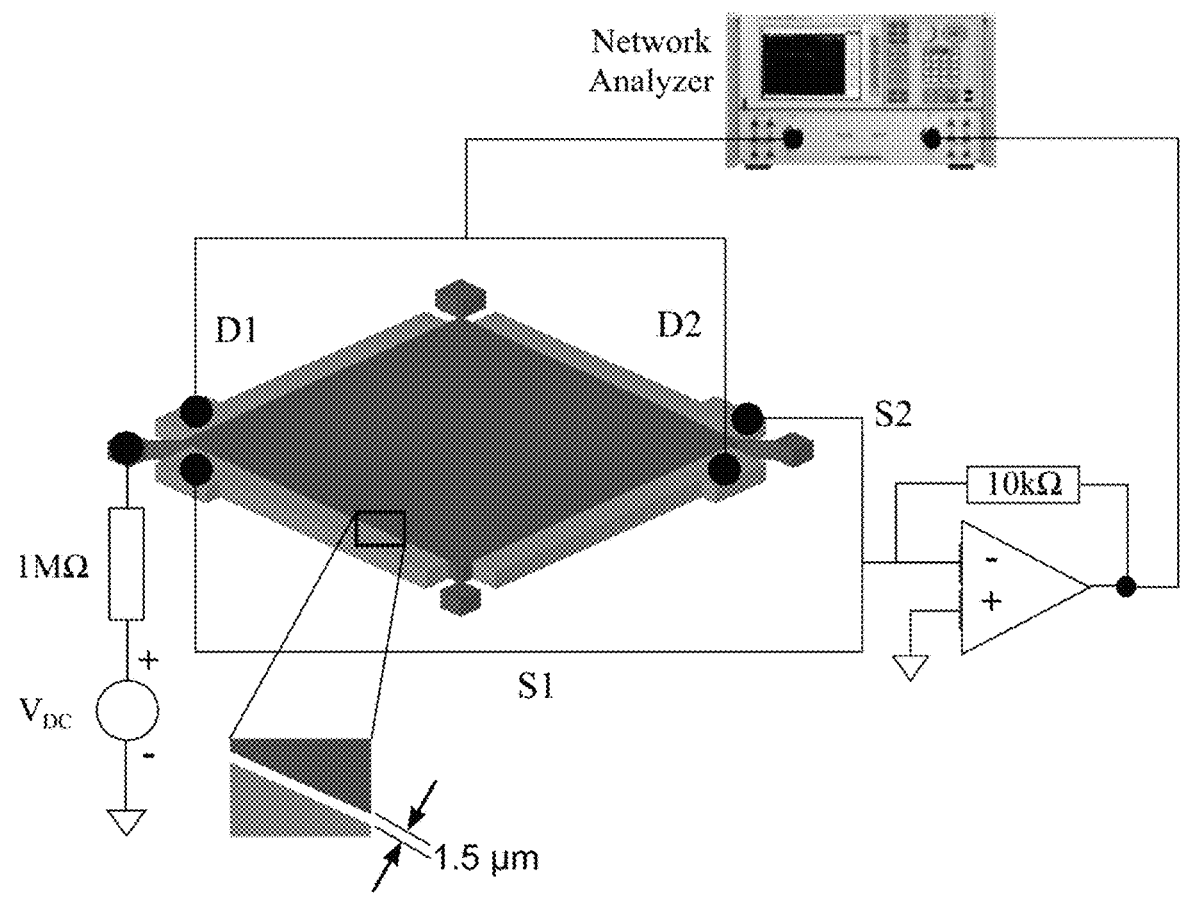
FIG. 4B depicts a single-ended measurement setup for a Lamé mode resonator according to an embodiment of the invention.

In one embodiment of the system, the in-plane Lamé mode is actuated using a single-ended configuration as shown in FIG. 4B. Two electrodes are used to provide drive signals that are in phase to the D1/D2 electrodes. Another set of electrodes, S1/S2, are used to collect the two in-phase output signals and recombine them. The in-plane electrodes would be separated from the resonator mass by a small gap, and in one embodiment can be on the order of 1.5 microns (see zoomed-in detail of FIG. 4B and FIG. 4G). The bias voltage is provided to the resonating mass using a fifth electrode.

Figure 4C:
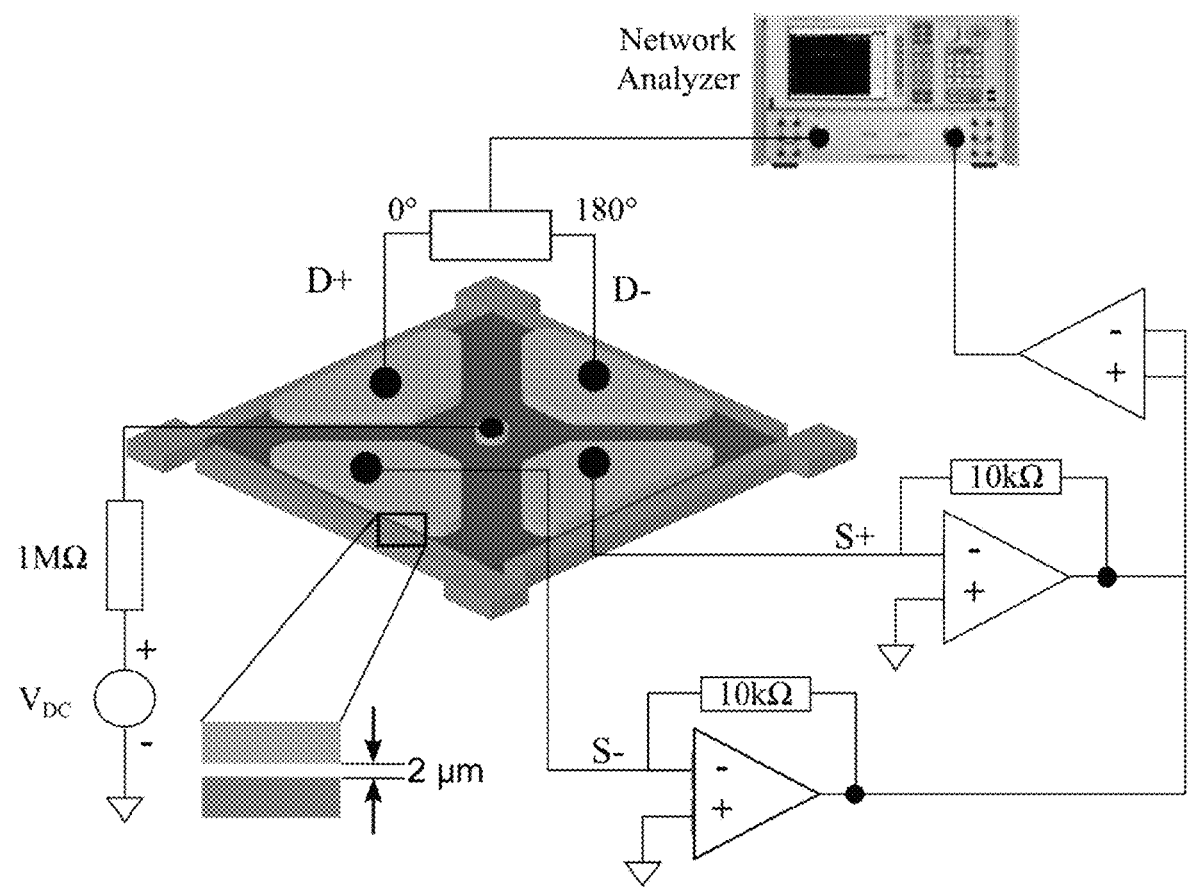
FIG. 4C depicts a differential measurement setup for a saddle mode resonator according to an embodiment of the invention.
Figure 4D:
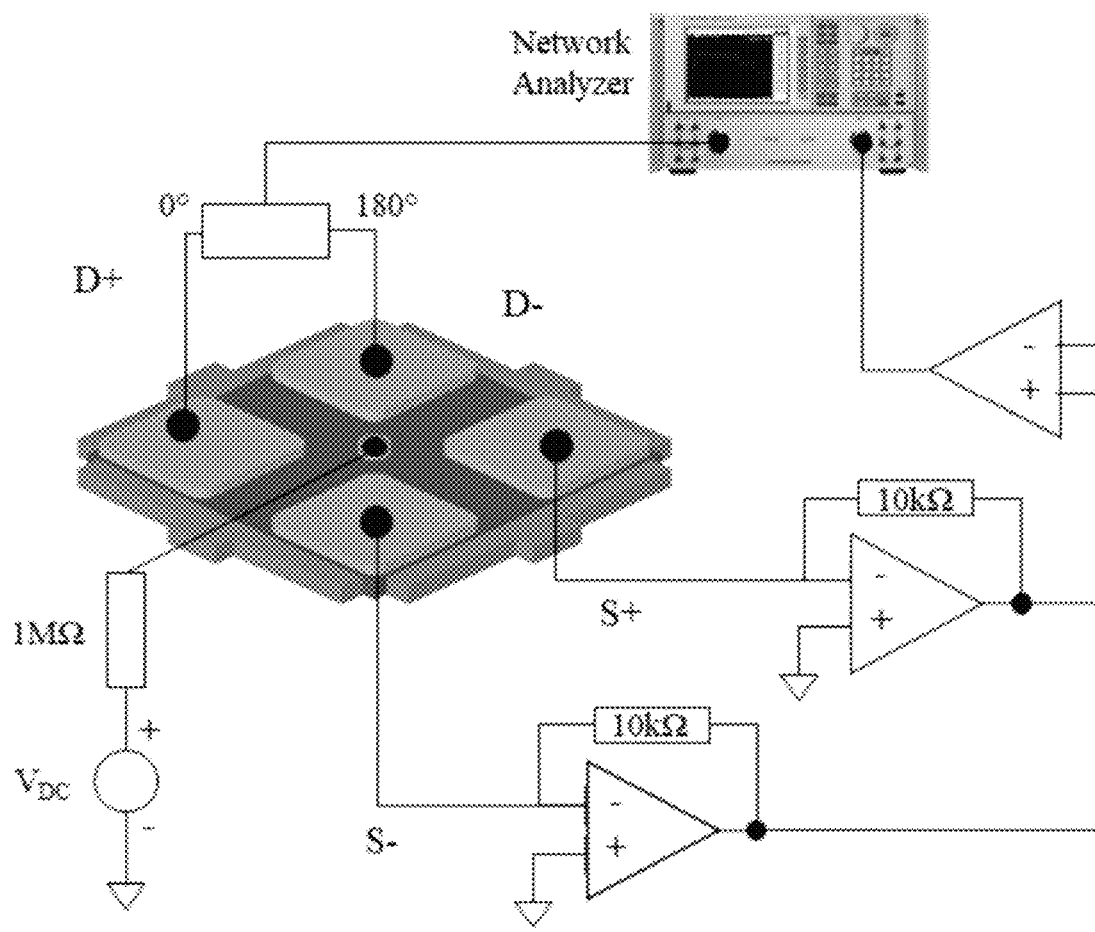
FIG. 4D depicts a differential measurement setup for a torsional mode resonator according to an embodiment of the invention.
Figure 4E:
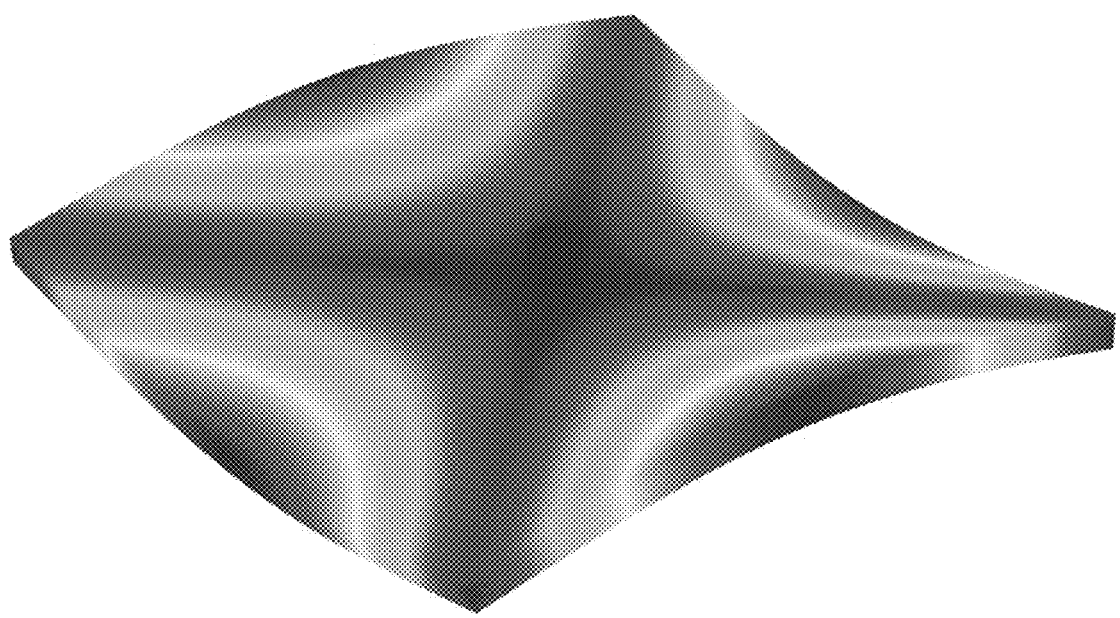
FIG. 4E depicts the out-of-plane saddle mode of a square resonator anchored at the central nodal point according to an embodiment of the invention.
Figure 4F:
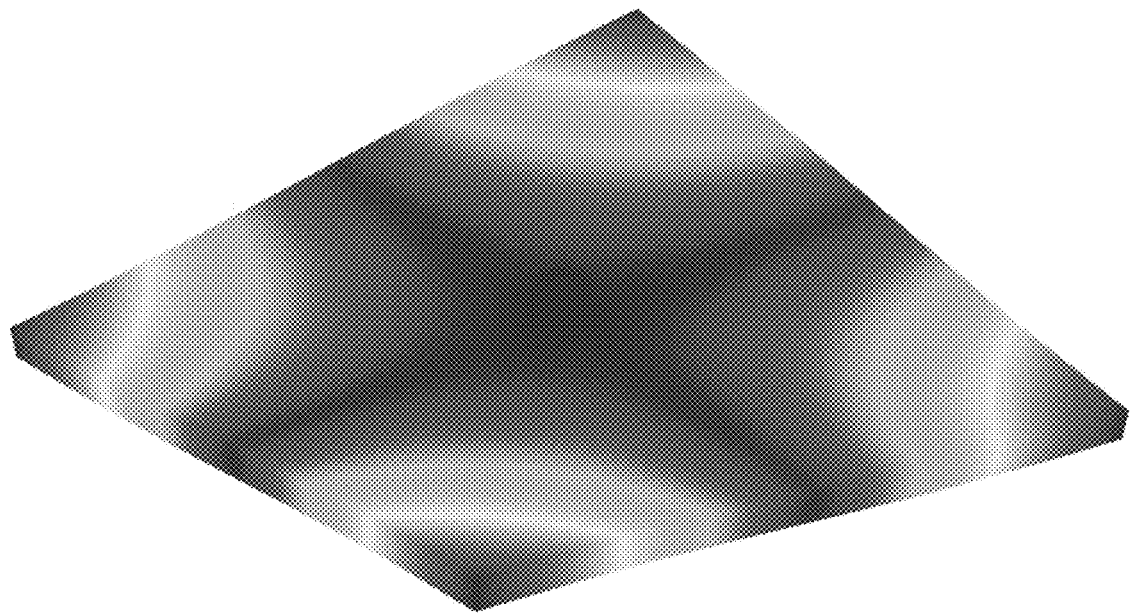
FIG. 4F depicts the out-of-plane torsional mode of a square resonator anchored at the central nodal point according to an embodiment of the invention.
Figure 4G:
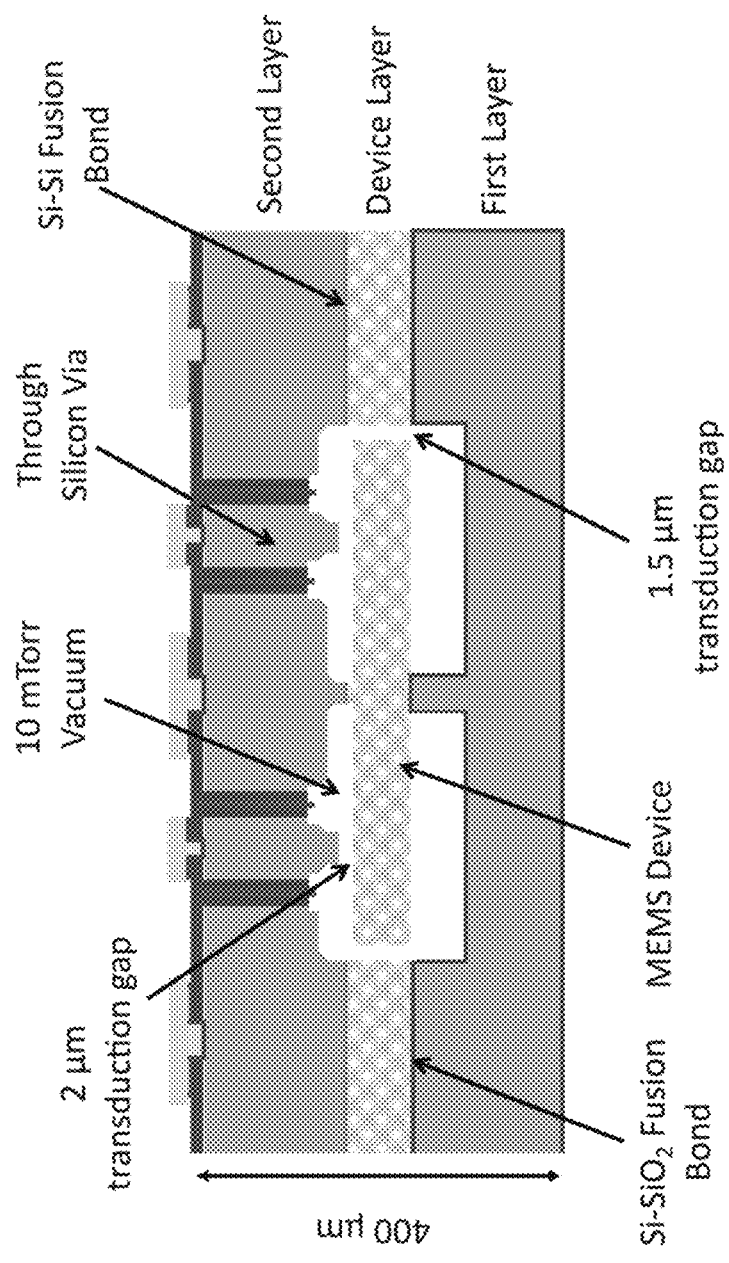
FIG. 4G depicts the cross-sectional schematic of resonators with in-plane and out-of-plane electrodes according to embodiments of the invention.

An out-of-plane mode of the resonator can be actuated and detected using electrodes in a layer that is either above or below the resonating mass. For example, excitation of the out-of-plane saddle mode (see FIG. 4E) is achieved using four out-of-plane electrodes centered above the edges of the square resonator as shown in FIG. 4D. The out-of-plane electrodes would be separated from the resonator mass by a small perpendicular gap, which in one embodiment is on the order of 2 microns (see zoomed-in detail of FIG. 4C and FIG. 4G). The out-of-plane electrodes are independent of the in-plane electrodes and the bias voltage electrode. If the resonator is centrally anchored, the anchor can be used to bias the resonator. The electrode configuration allows for operation in a differential configuration (as shown in FIG. 4C) or in a single-ended configuration.

In another embodiment of the system, excitation of the out-of-plane torsional mode (see FIG. 4F) is achieved using four out-of-plane electrodes located above the corners of the resonator mass as shown in FIG. 4D. The out-of-plane electrodes would be separated from the resonator mass by a small gap, and in one embodiment can be on the order of 2 microns. The out-of-plane electrodes are independent of the in-plane electrodes and the central anchor bias voltage electrode. The electrode configuration allows for operation in a differential configuration (as shown in FIG. 4D) or in a single-ended configuration.

Due to the methodology of the commercial MEMS process line described and depicted in FIGS. 20A-20F metallization of the thick silicon MEMS structures on either side is a relatively straight forward processing addition. However, it would be evident that in other MEMS manufacturing sequences the provisioning of additional electrodes underneath MEMS structural elements with wrap-around metallization etc. and on the upper surface may be implemented. Whilst upper surface metallization of a MEMS structural element may be considered a standard processing step as upper wafer metallization is required and implemented for electrical interconnect etc. techniques exist within the prior art such as reported by Nabki et al. in "Low-stress CMOS-compatible silicon carbide surface-micromachining technology-Part I: Process development and characterization" (J. Microelectromechanical Sys., Vol. 20.3, pp. 720-729), "Low-stress CMOS-compatible silicon carbide surface-micromachining technology—Part II: Beam resonators for MEMS above IC" (J. Microelectromechanical Systems, Vol. 20.3, pp. 730-744) and World Intellectual Property Office publication WO/2010/003,228 "Low Temperature Ceramic Microelectromechanical Structures".

C.2. Free-Free Beam Resonator

A free-free beam resonator comprises a main resonating structure, known as the Free-Free beam, and four supporting torsional beams placed at the flexural nodal points of the structure. The supports are suspended over the ground plate and subsequently connected to rigid contact anchors. An electrode next to the Free-Free beam is responsible for providing the required electrostatic excitation via an applied AC voltage ($V_{AC}$). A sensing electrode is located on the opposite side of the beam in order to "sense" the capacitive change. A DC bias voltage ($V_{DC}$) applied on the resonating structure is responsible for amplifying the weak electrostatic force that is created by $V_{AC}$. Such a free-free beam resonator according to an embodiment of the invention is depicted in FIG. 5 as a perspective schematic and with detail of the resonator showing the 30 μm thick MEMS beam and torsion mounts. Accordingly, the beam may support electrodes for the inventive tuning methodology.

C.3. 2-Ring Breathing Mode MEMS Resonator

A 2-ring breathing mode MEMS resonator consists of two ring resonators that operate in the so-called breathing mode of vibration, namely expansion-contraction. Through a fully differential drive/sensing configuration, as depicted in FIG. 6, cancellation of any feed-through and allows for reduction of the required DC bias. A mechanical beam is used to connect and couple the two breathing mode resonators where the beam is designed so that its extensional mode of vibration matches the extensional mode of the ring resonators. With appropriate design the resulting resonator is limited in Q by only the Akheiser limit and Thermo Elastic Dissipation (TED).

Referring to Table 1 there is presented performance of a 2-ring breathing mode resonator according to an embodiment of the invention exploiting 30 μm deep structures with gaps suited to high volume manufacturing on a wide range of commercial foundry processes.

TABLE 1

2-Ring Breathing Mode MEMS Resonator Performance

| Parameter | Performance |
|---|---|
| Resonant Frequency (MHz) | 10 |
| Quality Factor (Q) | ~400,000 |
| Polarization Voltage (V) | 5 |
| Gap (μm) | 1.5 |
| Vacuum Encapsulation | Yes |
| Vacuum Level | 1.5 Pa |
| Q at Atmospheric Pressure | ~400,000 |

C.4. 4-Ring Breathing Mode MEMS Resonator Using Disc Resonator Anchor

Figure 7A:
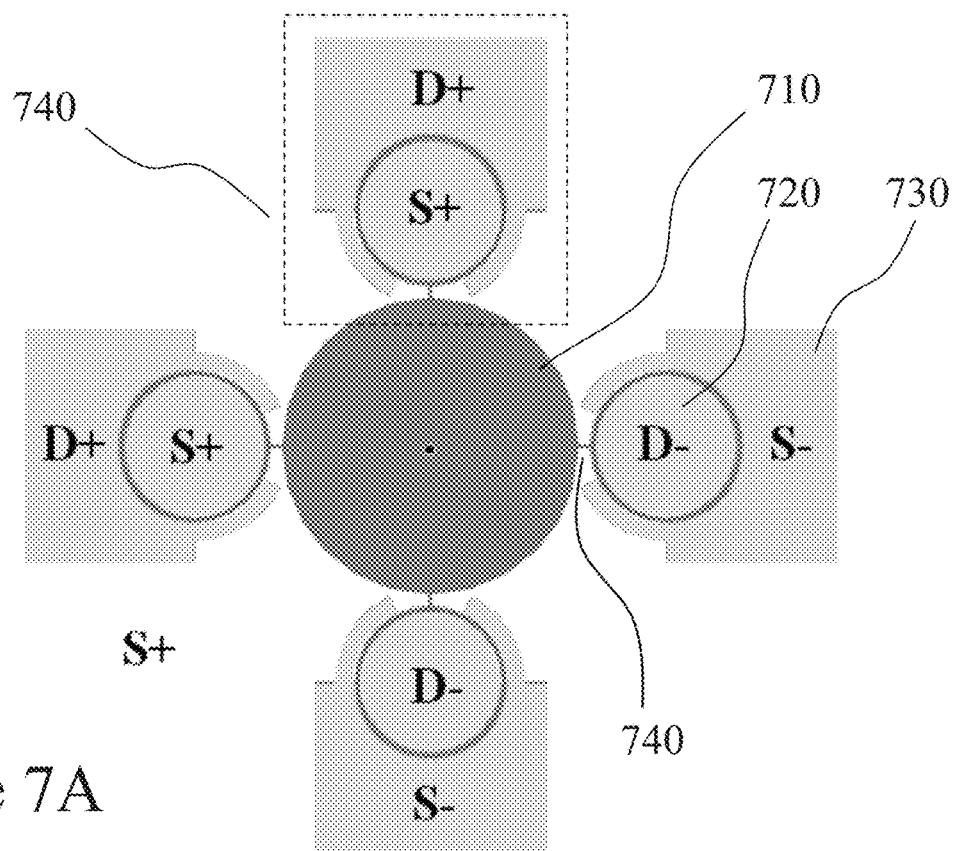
FIGS. 7A and 7B depict schematics of a 4-ring breathing-mode resonator using resonant disk anchors according to an embodiment of the invention.
Figure 7B:
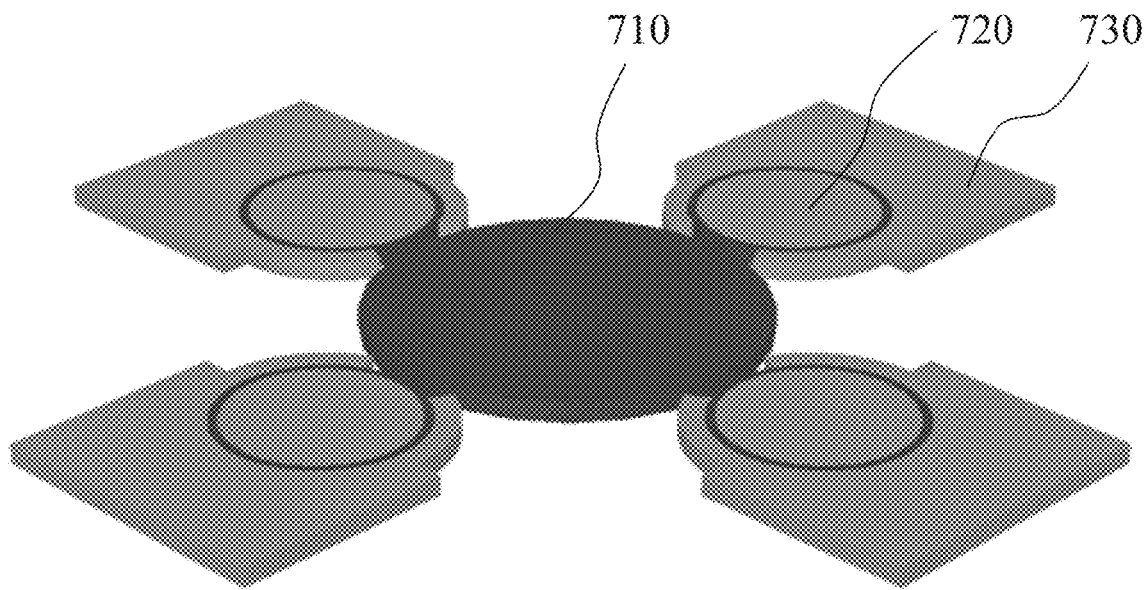

The inventors have established a MEMS resonator design employing ring resonators in combination with a central disk resonator which act as the anchor to the ring resonators. Accordingly, the MEMS resonator operates in the breathing mode and radial modes respectively. The disk resonator acts as the anchor of the device. Impedance matching is achieved by matching the resonant frequency of the central disk resonator and the ring resonators. Theoretically this is accomplished by matching equations (7) and (8) for the ring and disc respectively, where, E is the Young's modulus of elasticity, ρ is the density, v is Poisson's ratio, $R_1, R_2$ are the inner and outer radius of the ring resonator and R is the radius of the disk resonator. The structures are connected by short straight beams 740 as can be seen in FIGS. 7A and 7B which depict plan and perspective views of a 4-ring breathing mode MEMS resonator with a disc resonator anchor according to an embodiment of the invention. As depicted four ring resonators 740 each comprising disc/driving electrode 720 and sensing electrode 730 4.4 which are disposed around the periphery of the central disk resonator 710. The device can be operated using a fully differential configuration that cancels out the effects of the feedthrough capacitance. There are four actuation electrodes and 4 sensing electrodes. The DC bias is applied to the disk resonator through its central anchor.

$$f_{RING} = \frac{1}{2\pi}\sqrt{\frac{E}{\rho R_1 R_2}} \quad (7)$$

$$f_{DISC} = \frac{k_M}{2\pi R}\sqrt{\frac{E}{\rho(1-v^2)}} \quad (8)$$

This novel configuration has several advantages the prior art. Firstly, the impedance matching that can be achieved between the disk and ring resonators is of higher quality than what can be achieved between rings and beam structures. Effectively this leads to a higher f-Q product, which is an important issue in the operation of a resonator as an oscillator. The second advantage is that the use of four rings instead of two leads to a drastic drop in the motional resistance of the device. This is because the electrostatic transduction area is effectively doubled but without impacting the stiffness of the anchors. Thirdly, the disk-ring coupling allows for the introduction of additional ring resonators without significant changes to the design. The proposed design with four rings can be easily modified to include an additional four rings, leading to ultra-low power devices, with eight ring resonators. Whilst the design depicted in FIGS. 7A and 7B is a circular disk it would be evident that disk resonator designs such as square, octagonal, etc. may exploit the advantages of the ring resonators as anchors.

Figure 8:
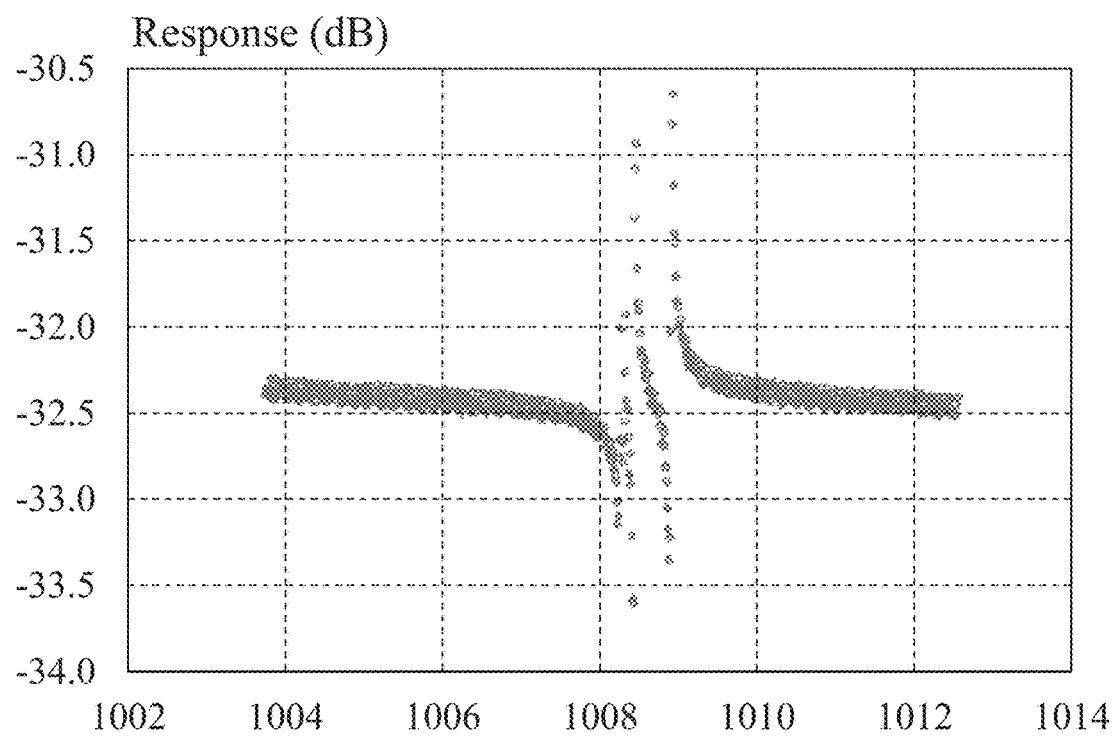
FIG. 8 depicts the frequency response of 4-ring disk-coupled resonator according to an embodiment of the invention showing peaks corresponding to the resonant frequencies of the disk and rings respectively.

Beneficially, a design variation of the disk resonator in combination with ring resonators can be used in order to create filter devices. Accordingly, a resonant frequency shift between the ring resonators and the disk resonator is introduced. FIG. 8 depicts such an instance with the frequency response wherein the four ring resonators have a slight resonant frequency offset compared to the disk resonator. Filters with different band-pass frequencies and band-pass frequency characteristics may be implemented by changing the dimensions of the ring resonators. It should be noted that the dimensions of each ring can be tuned independently in order to achieve the desired filter response. Further more complex combinations can be considered such that the disk resonator is offset from the ring resonators which are themselves offset as opposing pairs for example from the other opposing pairs of ring resonators.

It would be evident that the area of the disk resonator allows for the implementation of the inventive concept of additional control electrodes as described and discussed supra in respect of additional electrodes on the top or bottom side of the resonator that are independent of the DC bias (see Section A3.A).

Figure 9:
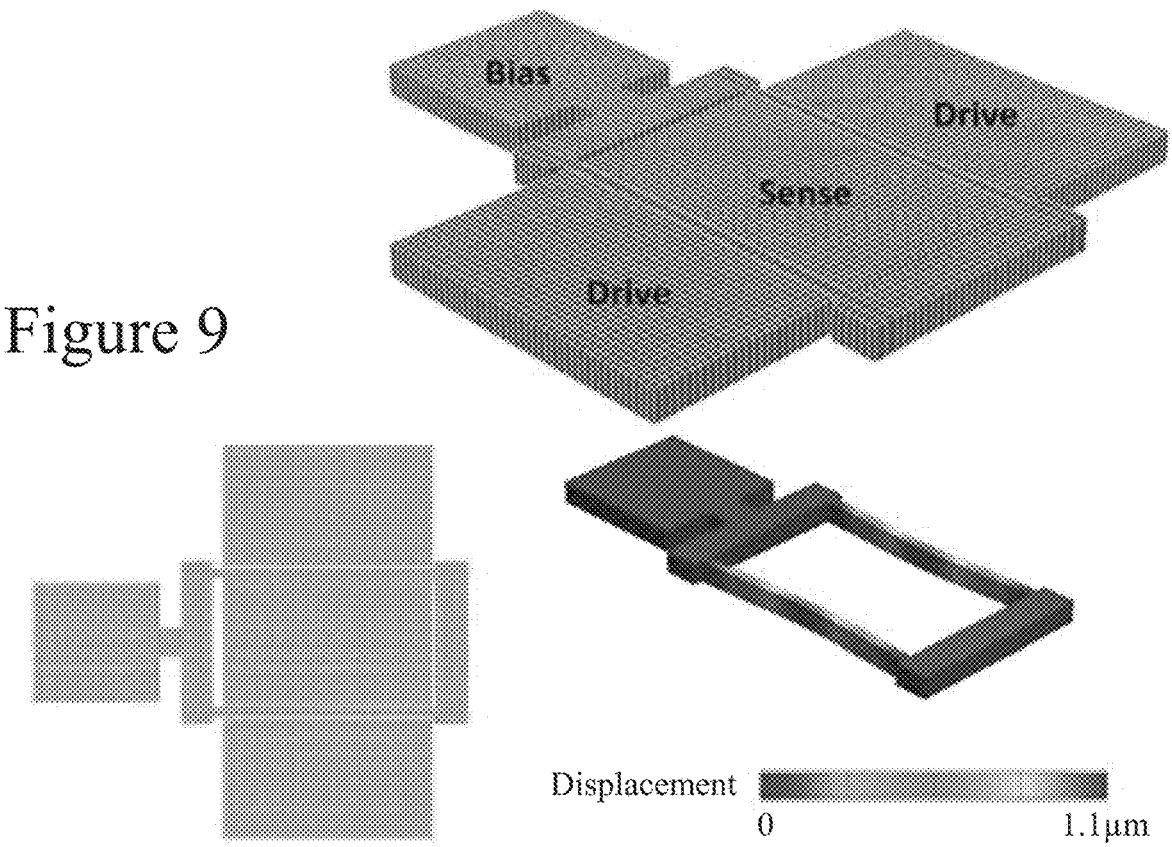
FIG. 9 depicts a double ended tuning fork resonator according to an embodiment of the invention.

C.5. Double Ended Tuning Fork Resonator:

Double Ended Tuning Fork (DETF) resonators as depicted in FIG. 9 consist of two clamped-clamped beams wherein the masses at the front and back of the beams couple them together so that they resonate at the same frequency. A bias voltage may be applied to the resonating structure whilst two drive electrodes are used in order to actuate each clamped-clamped beam. The capacitance change is measured from a center "sense" electrode. Based upon the commercial MEMS process line the inventors have established DEFT designs with large transduction gaps (≈1 μm) such that at 1 MHz a MEMS resonator according to an embodiment of the invention may operate with DC bias voltages in the range of 10-15V, while the quality factor is approximately 10,000. A DEFT may also allow for the implementation of the inventive concept of additional control electrodes as described and discussed supra in respect of additional electrodes on the top or bottom side of the resonator that are independent of the DC bias (see Section A3.A).

C.6. Post-Fabrication Gap Reduction

Within the prior art resonator structures are design, fabricated, and tested. The devices are calibrated and/or electrically tuned and if necessary their associated control/drive/sense electronics similarly electrically tuned or provided with the calibration data in order to compensate for variations in the manufacturing process. However, the inventors have established a design methodology that allows for post-fabrication reduction of the transduction gap in capacitive electrostatic devices. Accordingly, devices can be manufactured with larger electrode gaps, increasing yields and lower processing complexity, where the gaps are subsequently reduced for operation of the device.

The inventive method lies in the combination of two elements. First, the electrode configuration that is used is movable instead of fixed which is accomplished by anchoring the electrodes using a serpentine structure. The electrode structure can have a rectangular, elliptical or circular shape but it the embodiments described below it is open or "hollow". The second key element of the design is the inclusion of a stop or island anchor which, when the electrode structure is "hollow"/open, is inside the movable electrode. The overall configuration can be seen in FIG. 10. The initial electrode-stop gap is established at 1.55 µm, which for example, is just larger than the minimum gap size allowed by a commercial MEMS process line, 1.5 µm, although the desired operating regime for the MEMS devices is with a 0.05 µm gap. The initial electrode-resonator gap may be set at or above the minimum process value, which for example may be anything between above 1.5 µm, for the purposes of this work it was set to 1.55 µm. Accordingly, a voltage differential between the drive and/or sense electrode and the resonating mass pulls the electrode towards the resonating mass. After the electrode has moved the required distance, e.g. 1.5 µm, then it hits a "stop" structure. At this point the resulting electrode-resonator gap will be 0.05 µm. It would be evident that alternatively the electrode gap may be 1.75 µm and the stop set 1.70 µm away such that again the final resulting electrode-resonator gap will be 0.05 µm although the driving voltage to close the gap will be larger. Similarly the difference may be set to other values to establish other final gaps. It would be evident that design flexibility exists according to final target gap, process line constraints, etc.

Figure 10:
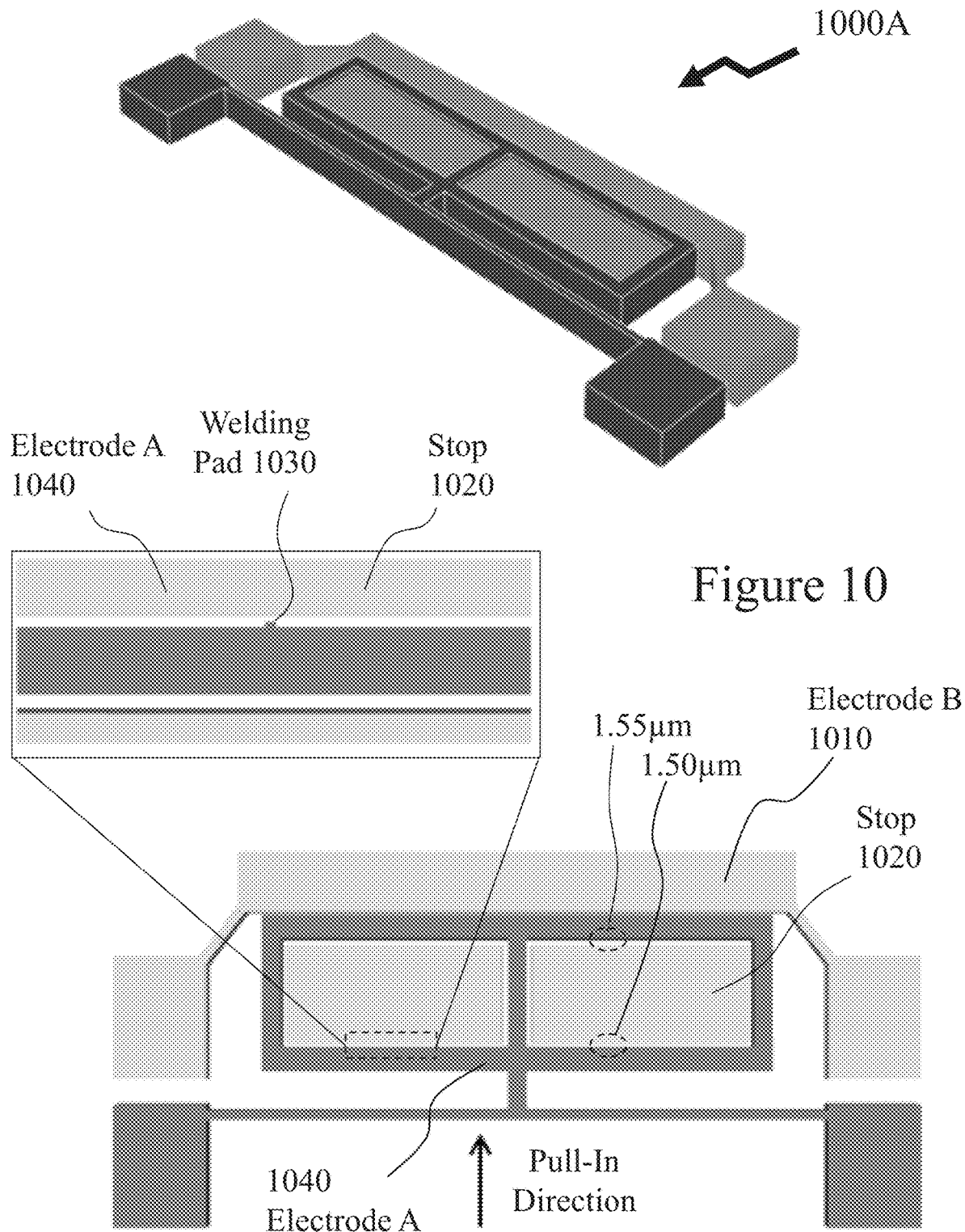
FIG. 10 depicts a movable electrode configuration according to an embodiment of the invention.

Referring to FIG. 10 there is depicted a perspective view 1000A of the inventive concept employing an open or "hollow" electrode A 1040 that has an edge disposed parallel to electrode B 1010. Within the electrode A 1040 is stop 1020 which on the upper side towards electrode B 1010 has a first gap, G1=1.55 µm, and on the lower side a second gap, G2=1.50 µm. Accordingly applying a voltage to electrode A 1040 results in pull-in of the electrode towards electrode B 1010 until the electrode A 1040 hits the stop 1020 such that the resulting gap between electrode A 1040 and electrode B 1010 is now G1−G2=1.55−1.50=0.05 µm.

Now if a current is passed through the electrode-stop contact (electrode B 1040-stop 1020) it will heat the area and if the current is increased sufficiently the silicon will melt and the two structures will be welded together. Within the prior art the welding of silicon has been reported but with prior art electrode configurations significant variation in the welding results was obtained which rendered the solution commercially unsuitable. The inventors surmise that the most likely reason for this was that the contact area was too large with wide asperity variability. The result is that there is a large probability that the contact resistance will be either too high or too low. Accordingly, the inventors have designed a variation to the electrodes which they refer to as "welding pads" 1030 as depicted in the expanded view of the region between stop 1020 and electrode B 1040. These are small structures that protrude from the face of the electrode or the stop structure. When the electrode pulls in to the "stop" structure, the welding pad will be the only contact area. A current passing through the electrode-stop contact will only melt the welding pad. While the contact resistance is likely to increase, the repeatability and reliability of the welding will increase. For example, a configuration of the welding pad on each side of the structure may be 5 µm×0.5 µm (W×L) such that the majority of the electrode-stop are separated by the welding pad 1030 length, e.g. L=0.50 µm. It would be evident that it would be possible to increase or decrease the number or dimensions of the welding pads depending on desirable contact resistance.

It would also be evident that whilst the configuration of an open electrode with stop disposed within is conceptually and topographically neat that other embodiments may be implemented without departing from the scope of the invention. In essence all that is required is a portion of the electrode and a stop are disposed at a predetermined spacing, such that pull-in of the electrode results in the electrode contacting the stop such that the electrode is now disposed at the desired separation from another electrode or feature of the MEMS device, and that the structure allows electrical current flow to weld the stop and electrode together. As noted the employment of small "welding pads" provides welding controllability to allow the method to operate within a commercial MEMS production environment. As the separation is mechanically limited it would be evident that the electrode pull-in and welding process may be automatically performed on MEMS devices employing embodiments of the invention.

Referring to FIG. 11 there are depicted perspective 1100A and plan 1100B views of the electrode gap reduction method according to an embodiment of the invention applied to the design and manufacture of a square Lamé mode resonator. However, it would be evident that the design methodology can be used on any capacitive electrostatic device. With the square Lamé mode resonator the movable electrode structure was replicated on each of the four sides of the resonator. Analysis by the inventors indicates that the motional impedance of the device is expected to drop by more than 90%.

C.7. Centrally Anchored Bulk Mode Resonators

Within the description supra resonators have been primarily described and depicted with edge/corner anchors. However, resonators may be formed using a central anchor such as depicted in first image 1200A in FIG. 12 which depicts a so-called "wine-glass mode" of vibration for a circular disk resonator, whilst second image 1200B in FIG. 12 depicts the Lamé mode of vibration for a square resonator. Both modes can be seen to have 5 quasi-nodal points, four located in the perimeter of the resonant element and one in the center. Within the prior art bulk mode resonators have been anchored using the quasi-nodal points located at the perimeter. However, a significant issue for such approaches is that as the size of the resonator increases then there is a significant increase in the complexity required for the design and fabrication of the anchors. Further, such anchors make it effectively impossible to couple two consecutive bulk mode resonators in order to create a filter.

An essential factor in the prior art solutions maintaining perimeter anchors has been that the commonly available microfabrication processes do not allow for the fabrication of designs anchored using the center nodal point whilst at the same time providing an electrically conductive path. However, the inventors have overcome these limitations through the exploitation of a multi-wafer MEMS fabrication process comprising three wafers. These being:

a first (bottom) wafer which is etched in order to create a deep cavity (e.g. 30 µm deep) together with a small island which is strategically not etched in the center and will be subsequently used to anchor the resonating element;

a second wafer, for example 30 µm thick, is then fusion-bonded with the first wafer and processed using deep reactive ion etching (DRIE) in order to define the resonator structure; and a third wafer is patterned with Through Silicon Via (TSV) which are to provide electrically conductive paths to the vacuum encapsulated device when the third wafer is fusion bonded to the second wafer in a vacuum environment which has a cavity also etched into it (e.g. 20 µm deep) together with another small island which is strategically not etched in the center and will be subsequently used to anchor the resonating element.

Figure 13:
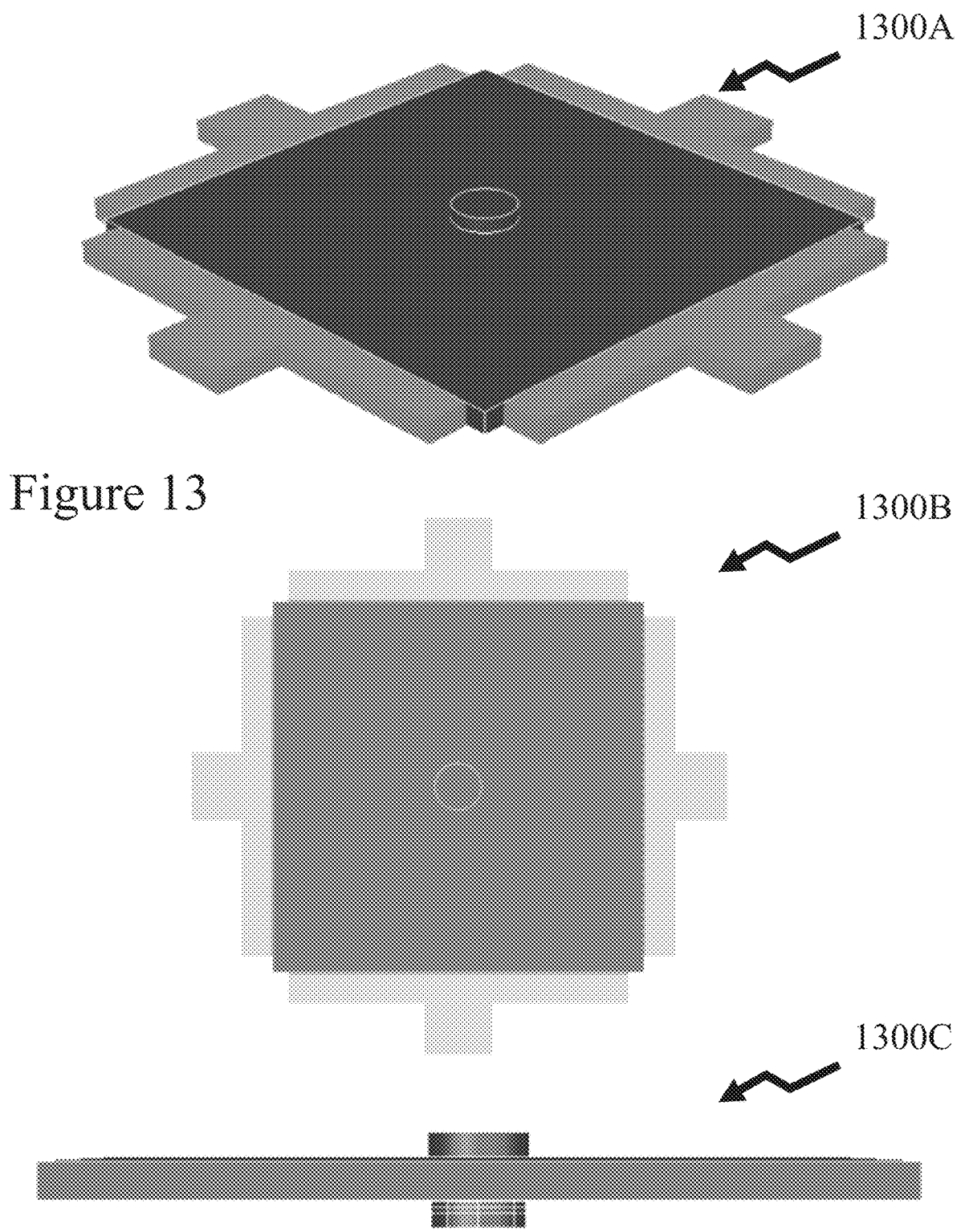
FIGS. 13 and 14 depict schematics of centrally anchored Lamé mode and disk resonators according to embodiments of the invention.
Figure 14:
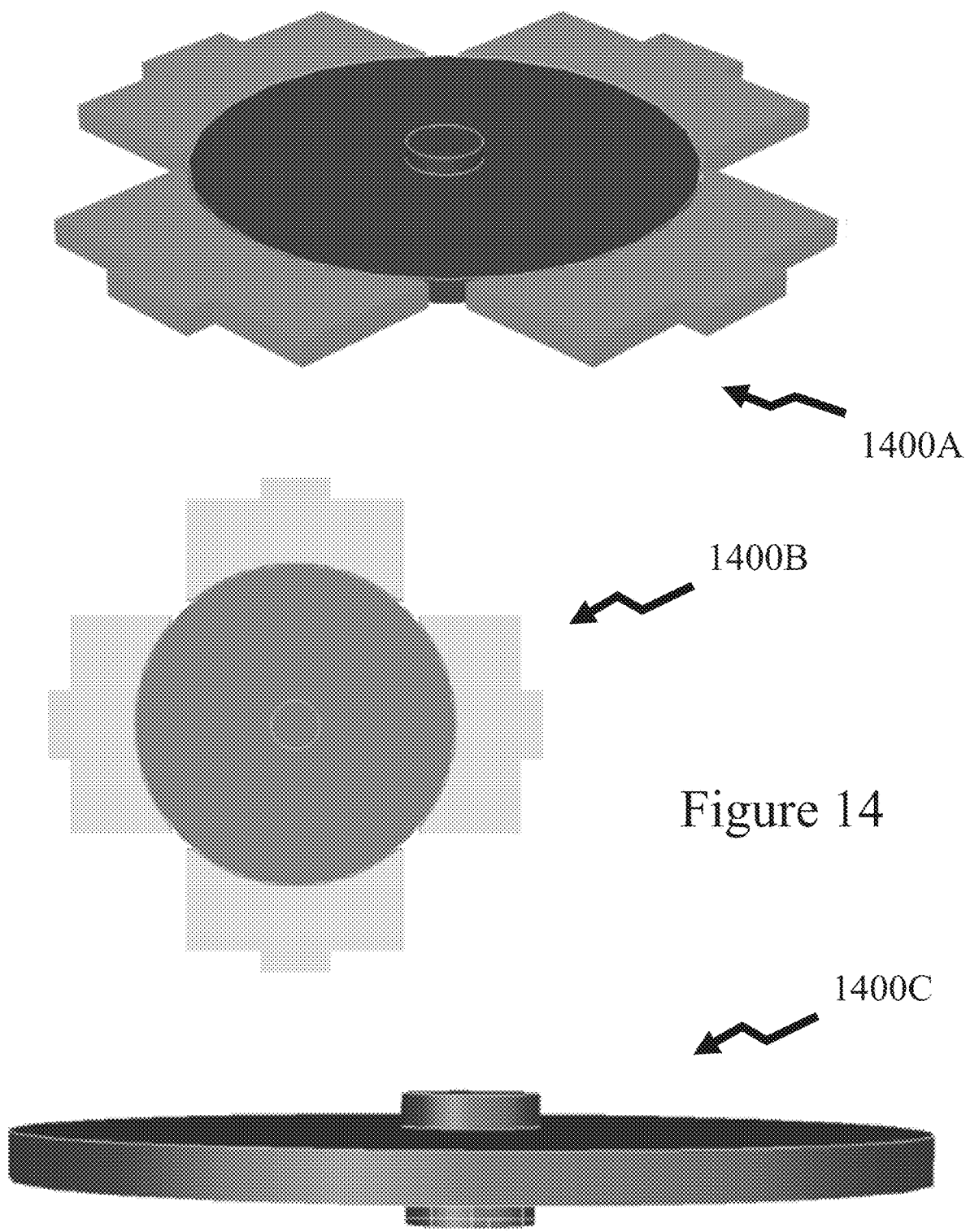

A TSV is strategically placed so that it aligns with the center of the bulk mode resonator. Implementations for both a square and a disk bulk mode resonator are shown in FIGS. 13 and 14 respectively which have been fabricated and fully characterized. The resulting cross-section from such an assembly is depicted in FIG. 15 wherein the resonator is evident in the center mounted to the lower "island" formed within the first wafer and "pinned" by the subsequent attachment of the third wafer and it's "island" after the resonator has been DRIE'd to separate it from the second wafer. An exemplary manufacturing process is described below in respect of Section D. The results obtained for square and circular summarized in Table 2 below. These results show that the performance of the proposed devices is equivalent to on par with current state of the art devices. Such centrally anchored resonators have significant benefits including the ability to couple multiple resonator devices together in order to create a filter or in order to lower the motional impedance of a composite resonator. Additionally, a reduction in the central anchor diameter would be anticipated to increase the quality factor of the devices.

TABLE 2

Experimental Results for Disk and Square Resonators with Central Anchor

|  | Central Anchor-Disk | Central Anchor-Square |
| --- | --- | --- |
| Resonant Frequency (MHz) | 8.75 | 6.91 |
| Quality Factor (Q) | 823,000 | 779,000 |
| Polarization Voltage (V) | 20 V | 50 V |
| Transduction Gap (μm) | 1.5 | 1.5 |
| Vacuum Encapsulation | Yes | Yes |
| Vacuum Level | 1.5 Pa | 1.5 Pa |

C.8. Corner Anchored Square Lamé Mode Resonator

A square Lamé mode resonator with dimensions 600 μm×600 μm×30 μm was fabricated using an exemplary fabrication process described in Section D on <100> orientated silicon. The design, shown schematically in FIG. 3, employs four straight anchors, 60 μm×10 μm×30 μm to support the resonator. The inventors deemed that T-shape anchors were not necessary as the resonator is not operated in the square-extensional mode. The transduction gap was designed to be 1.5 μm to meet the minimum gap size allowed by the fabrication process adopted. As noted supra whilst this gap is large for electrostatically actuated resonator, but the thickness (30 μm) of the device allows the polarization voltage to be kept down to around 40V. Referring to FIG. 16 there are depicted first to third images 1600A to 1600C respectively which are:

First image 1600A depicts SEM cross-sectional images of the encapsulated Lamé resonator according to an embodiment of the invention;
Second image 1600B depicts packaged resonator dies measuring 1 mm×1 mm; and
Third image 1600C depicts a detailed SEM view of the TSV and the 1.5 μm transduction gap.

Figure 17:
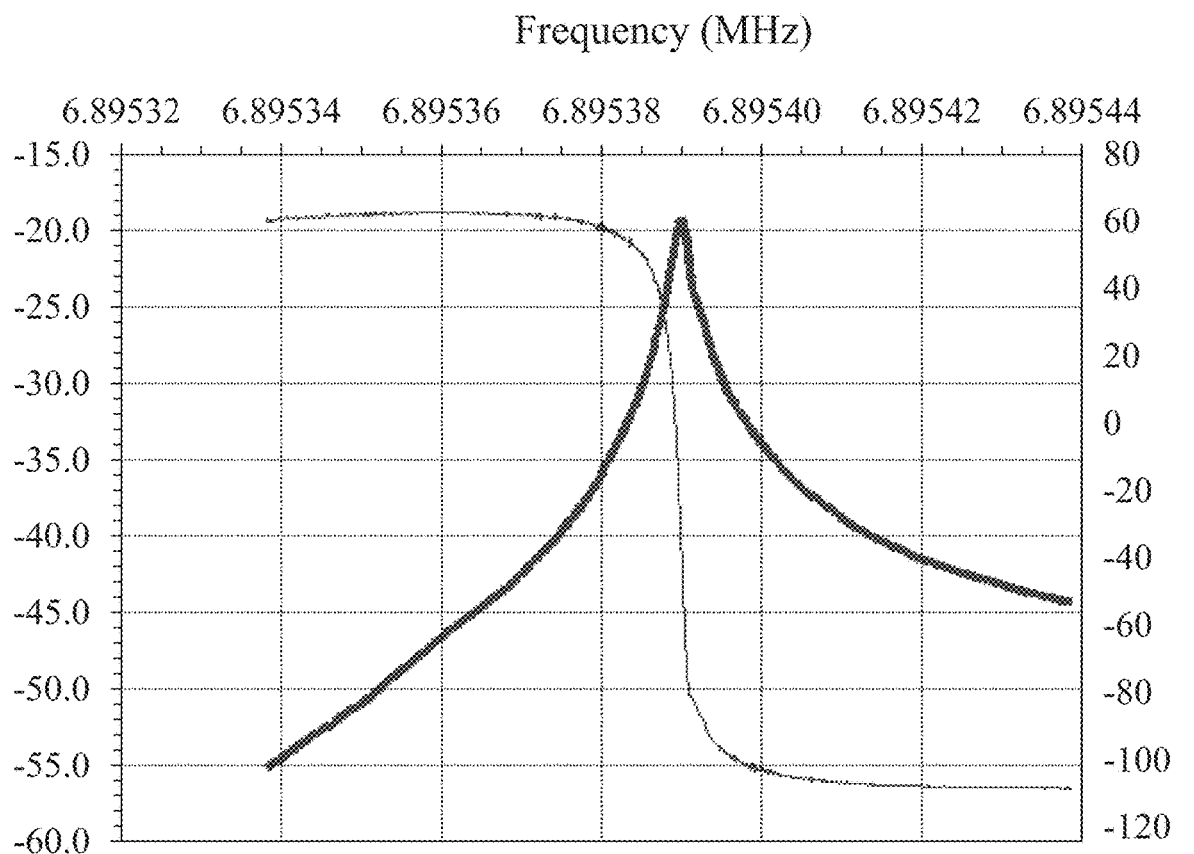
FIG. 17 depicts the electrical characteristics of a square Lamé resonator with corner anchors according to an embodiment of the invention.
Figure 17:
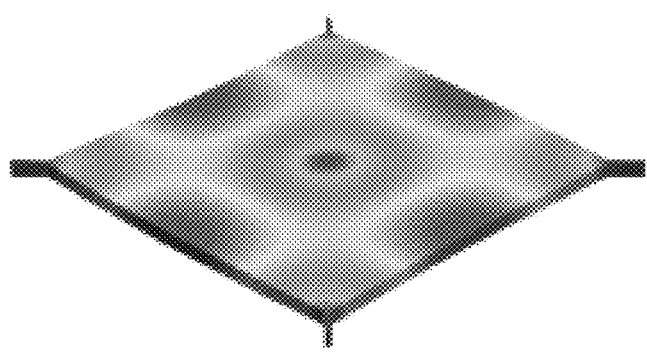

The resonator die were attached to a circuit board, with epoxy, and wire bonded to the board traces wherein they were characterised with an experimental configuration as depicted in FIG. 3 wherein the resonators are configured with fully differential drive and detection. Differential drive being via a power splitter connected to the output of a vector network analyzer with drive power of 0 dBm. For sensing a pair of low input bias current transimpedance amplifiers (TIAs) were employed which were subsequently combined and amplified using another low noise instrumentation amplifier. An example of an extracted frequency response of a Lamé mode resonator according to an embodiment of the invention is depicted in FIG. 17. At an applied polarization voltage of 40V, the resonant frequency was 6.8953 MHz, while the quality factor (Q) was calculated to be $3.24 \times 10^6$ which yields a f–Q product of $22.3 \times 10^{12}$ Hz which the inventors believe is the highest reported value for wafer-level vacuum encapsulated silicon resonators.

Figure 18:
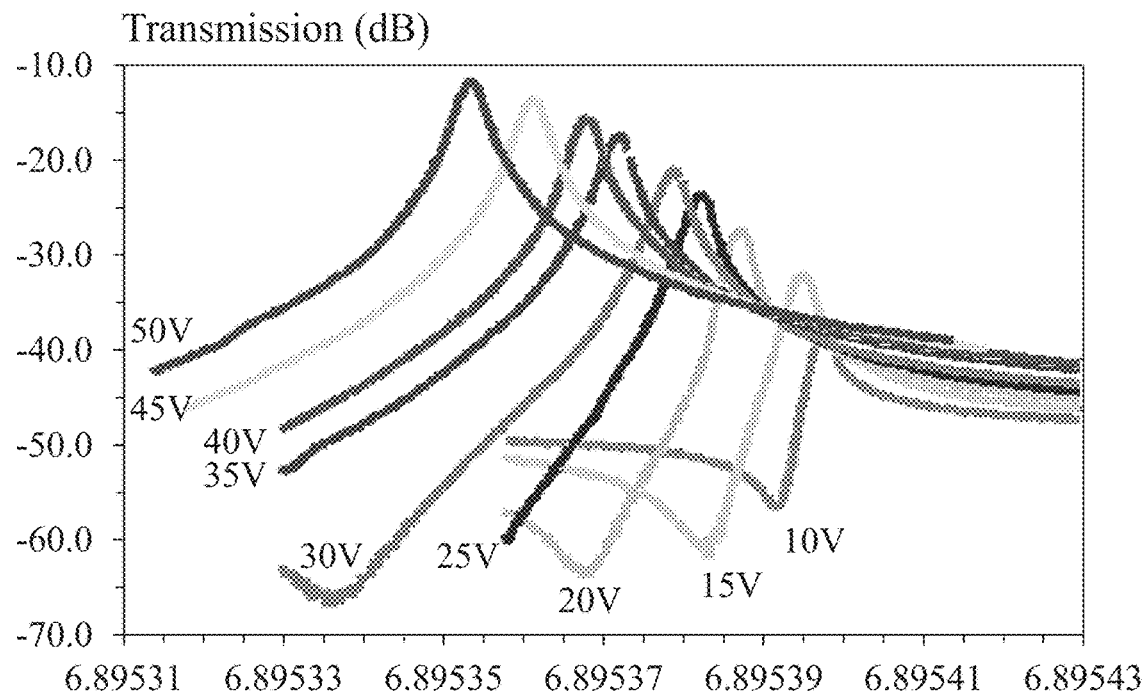
FIG. 18 depicts the electrostatic softening of the resonant frequency for a square Lamé mode resonator according to an embodiment of the invention.
Figure 19:
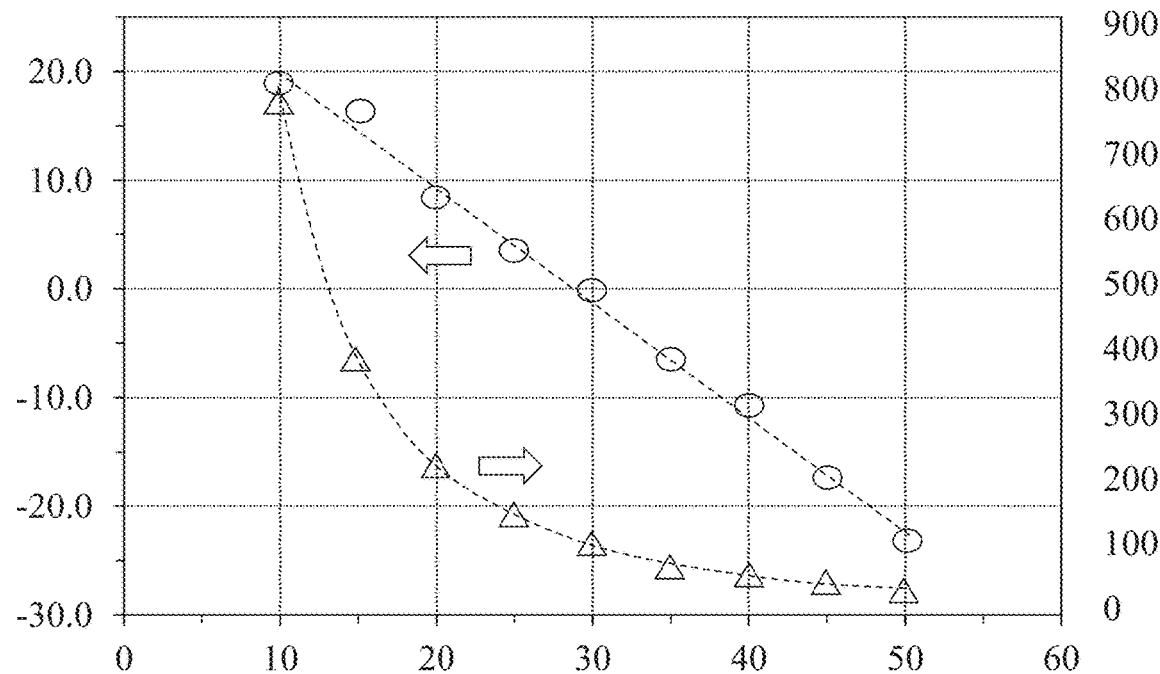
FIG. 19 depicts the variation of motional resistance and resonant frequency with bias voltage for a square Lamé mode resonator according to an embodiment of the invention.

Now referring to FIG. 18 results for sweeping the polarization voltage are depicted allowing the electrostatic frequency tuning and linear regime of the resonator to be measured. As expected, the resonant frequency decreases with increasing bias voltage due to electrostatic softening effect. The data from the frequency responses was analyzed in order to extract the motional resistance of the device and derive an expression for the frequency tuning which are depicted in FIG. 19 wherein over the tested range from 10V to 50V there is a linear relationship between the polarization voltage and the frequency shift with an approximate 45 Hz range with a resulting sensitivity of ~1.1 Hz/V The total frequency change is only ~45 Hz, leading to a sensitivity of approximately 1.1 Hz/V. Beneficially this means frequency stability in light of power supply variations as arise in many mobile, portable, and wearable devices. However, temperature tuning is limited. The motional resistance of the device follows an exponential relation to the bias voltage wherein the lowest value obtained is 37 kΩ at a bias voltage of 50V. Non-linear effects are introduced above that value.

D. Fabrication

D.1. Exemplary Process Sequence

Referring to FIG. 20A there is depicted an exemplary process flow wherein three sub-process flows for handling wafer, device wafer, and through silicon vias (TSVs) are employed. Subsequent to completion of the handling wafer processes this is then bonded to the device wafer by wafer-wafer bonding. This assembly then undergoes additional combined handling and device wafer processing. In the third process flow TSVs are implemented as required in the top layer wherein this is then bonded to the handling/device wafer combination.

FIG. 20B there is depicted an image of a handling wafer lower cavity pattern, e.g. 30 μm recess.

FIG. 20C depicts the handling wafer bonded to the device wafer, typically, 30 μm thick, wherein the device wafer may have been pre-processed to form other MEMS structures that will be formed as part of the final die. Such MEMS structures, may include, but are not limited to, temperature sensors, humidity sensors, gas sensors, and accelerometers, see for example El-Gamal et al in "Methods and Systems for Humidity and Pressure Sensor Overlay Integration with Electronics" (U.S. Patent Publication 2014/0,125,359).

Figure 20D:
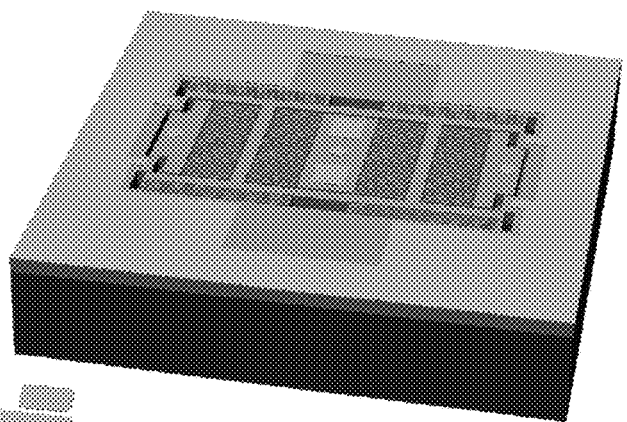

FIG. 20D wherein through silicon vias (TSV) are fabricated together with the upper sense cavity, typically for example 2 μm-5 μm but can be thicker.

Figure 20E:
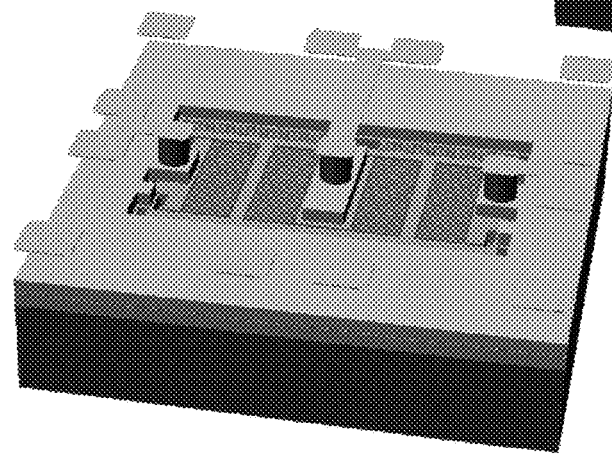

FIG. 20E wherein the TSV wafer has the upper cavity formed, typically 30p deep, followed by formation of the metallization for electrical contacts. Additionally, the handling/device wafer is bonded to the TSV wafer via wafer-wafer bonding with establishment of the interconnect metallization.

Figure 20F:
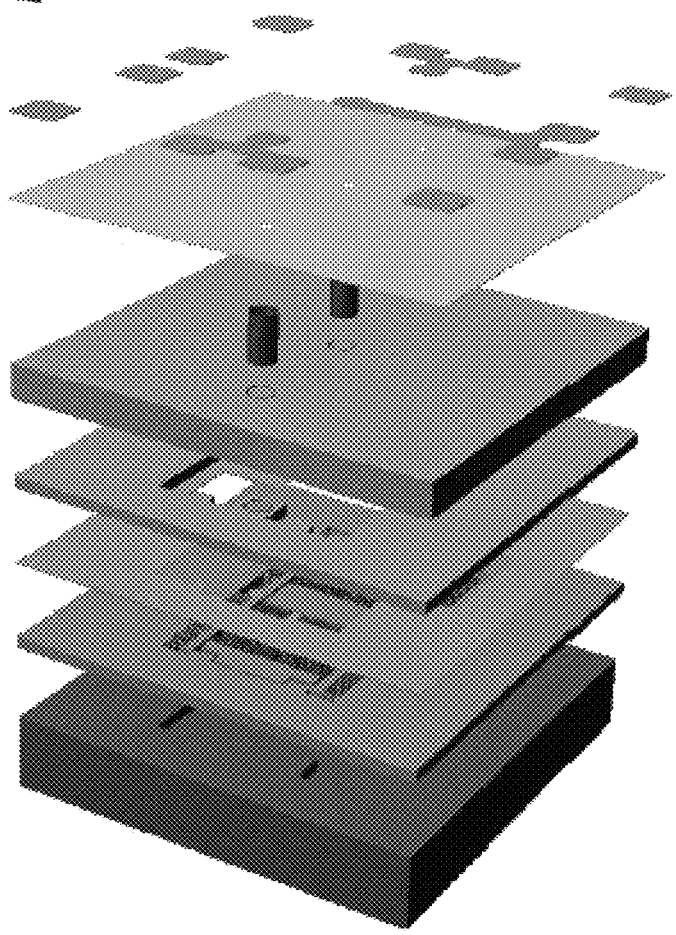
FIG. 20F depicts an exploded perspective view of a MEMS resonators according to embodiments of the invention exploiting a commercial MEMS fabrication process line.

FIG. 20F depicts an exploded view of final assembled stack for MEMS pressure sensor according to an embodiment of the invention.

The manufacturing sequence described and depicted in FIG. 20A to 20F may exploit a combination of standard semiconductor processes including, but not limited to, wet etching, dry etching, photolithography, reactive ion etching, deep reactive ion etching, chemical vapour deposition (CVD), plasma enhanced CVD, electron-beam evaporation, electron beam lithography, and thermal evaporation.

Accordingly, considering such a process flow the resulting structure is a device layer having active elements disposed between upper and lower cavities formed within the top and handling layers respectively. The environment at the time of bonding these top, device and handling layers together allows the environment within the cavity or cavities to be controlled. In the instance the membrane within the device layer is as large as the cavity then two cavities are formed but in the instance that the membrane is not then there is a single cavity with the membrane (i.e. beam) disposed within. Accordingly, a resonator may be packaged within a hermetic very low pressure environment for a high quality factor or a cavity sealed at very low pressure.

D.2. CMOS Electronics Integration

Figure 21:
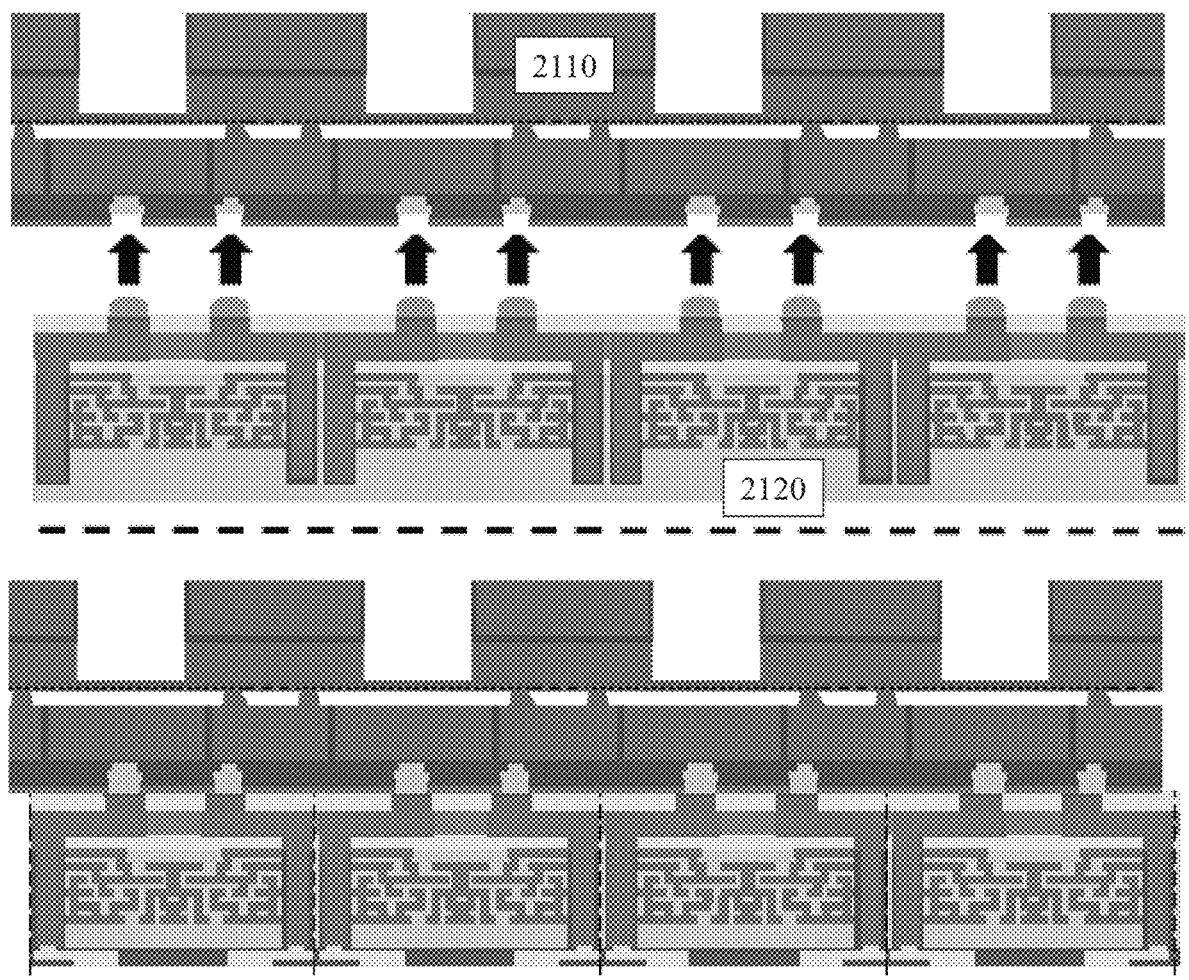
FIG. 21 depicts flip-chip bonding of a MEMS resonator according to embodiments of the invention exploiting a commercial MEMS fabrication process line.

Referring to FIG. 21 there is depicted an exemplary integration methodology for MEMS pressure sensors according to an embodiment of the invention wherein a fabricated array/die/wafer of MEMS pressure sensors 2110 is flipped and aligned relative to a CMOS electronics 2120 die/wafer. These are then brought together under conditions that the contact bumps, e.g. Au/Sn on the CMOS electronics 2120 die/wafer join to the metallization on the MEMS pressure sensors 2110, e.g. Au/Sn as well, to form a bond and electrical contact.

Beneficially, embodiments of the invention provide a fabrication process which is designed to be fully compatible with monolithic integration above CMOS electronics, and other electronics technologies that can withstand the low processing temperatures of embodiments of the invention. Beneficially this provides:

direct integration over the electronics;
improved system performance through reduced parasitic effects;
reduced die size;
increased electronics selection freedom, allowing for use of high performance technological nodes
reduced package footprint and thickness;
self-aligned processing;
lower sensor fabrication costs through batch processing;
integral reference elements; and
integral heaters and/or temperature stabilization.

The foregoing disclosure of the exemplary embodiments of the present invention has been presented for purposes of illustration and description. It is not intended to be exhaustive or to limit the invention to the precise forms disclosed. Many variations and modifications of the embodiments described herein will be apparent to one of ordinary skill in the art in light of the above disclosure. The scope of the invention is to be defined only by the claims appended hereto, and by their equivalents.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

What is claimed is:

1. A MEMS device comprising:
a MEMS resonating element arranged in a device layer of the MEMS device;
a lower cavity formed within a first layer of the MEMS device that is different from the device layer, wherein the lower cavity includes a first island at a first predetermined location;
an upper cavity formed within a second layer of the MEMS device that is different from the first layer and the device layer, wherein the upper cavity includes a second island at a second predetermined location, and wherein the MEMS resonating element is centrally anchored by the first and second islands;
a first set of electrodes for electrostatic actuation and sensing of the MEMS resonating element, wherein the first set of electrodes is arranged in the device layer of the MEMS device; and
a second set of electrodes for electrostatic actuation and sensing of the MEMS resonating element, wherein the second set of electrodes is separated from the first set of electrodes, and wherein the second set of electrodes is located in the second layer or the first layer of the MEMS device.

2. The MEMS device according to claim 1, wherein:
the first set of electrodes is capacitively coupled to a side surface of the MEMS resonating element, and the second set of electrodes is capacitively coupled to a top or bottom surface of the MEMS resonating element.

3. The MEMS device according to claim 2, wherein:
a first gap between the first set of electrodes and the side surface of the MEMS resonating element is smaller than a second gap between the second set of electrodes and the top surface of the MEMS resonating element.

4. The MEMS device according to claim 3, wherein:
the first gap is 1.5 microns and the second gap is 2 microns.

5. The MEMS device according to claim 1, wherein:
the MEMS resonating element is DC biased using any one of the first or second islands.

6. The MEMS device according to claim 1, wherein:
the second set of electrodes is electrically connected to an exterior surface of the second layer by a through silicon via (TSV).

7. The MEMS device according to claim 1, wherein:
the device layer, first layer, and second layer are all separate semiconductor substrates that are bonded together.

8. The MEMS device according to claim 1, wherein:
the MEMS resonating element comprises at least one of a disk resonator, a square resonator, a breathing mode resonator, a multi-ring breathing mode resonator, a Lame mode resonator, or a wine-glass mode resonator.

9. A MEMS device comprising:
a MEMS resonating element arranged in a device layer of the MEMS device;
a lower cavity formed within a first layer of the MEMS device that is different from the device layer;
an upper cavity formed within a second layer of the MEMS device that is different from the first layer and the device layer, wherein the MEMS resonating element is anchored in the device layer between the lower and upper cavities;

a first set of electrodes for electrostatic actuation and sensing of the MEMS resonating element, wherein the first set of electrodes is arranged in the device layer of the MEMS device; and a second set of electrodes for electrostatic actuation and sensing of the MEMS resonating element, wherein the second set of electrodes is electrically isolated from the first set of electrodes, and wherein the second set of electrodes is located in the second layer or the first layer of the MEMS device.

10. The MEMS device according to claim 9, wherein:
the lower cavity includes a first island at a first predetermined location;
the upper cavity includes a second island at a second predetermined location; and
the MEMS resonating element is anchored by the first and second islands.

11. The MEMS device according to claim 10, wherein:
the MEMS resonating element is anchored by the first and second islands at a periphery of the MEMS resonating element.

12. The MEMS device according to claim 10, wherein:
the MEMS resonating element is DC biased using any one of the first or second islands.

13. The MEMS device according to claim 10, wherein:
the MEMS resonating element is centrally anchored by the first and second islands.

14. The MEMS device according to claim 9, wherein:
the first set of electrodes is capacitively coupled to a side surface of the MEMS resonating element, and the second set of electrodes is capacitively coupled to a top or bottom surface of the MEMS resonating element.

15. The MEMS device according to claim 14, wherein:
a first gap between the first set of electrodes and the side surface of the MEMS resonating element is smaller than a second gap between the second set of electrodes and the top surface of the MEMS resonating element.

16. The MEMS device according to claim 15, wherein:
the first gap is 1.5 microns and the second gap is 2 microns.

17. The MEMS device according to claim 9, wherein:
the MEMS resonating element comprises at least one of a disk resonator, a square resonator, a breathing mode resonator, a multi-ring breathing mode resonator, a Lame mode resonator, or a wine-glass mode resonator.

18. The MEMS device according to claim 9, wherein:
the second set of electrodes is electrically connected to an exterior surface of the second layer by a through silicon via (TSV).

19. The MEMS device according to claim 9, wherein:
the device layer, first layer, and second layer are all separate semiconductor substrates that are bonded together.

20. The MEMS device according to claim 9, further comprising:
a CMOS electronics circuit which is attached to the second layer on a side of the second layer that is opposite to the upper cavity.

* * * * *